(12) United States Patent
Won et al.

(10) Patent No.: US 11,662,264 B2
(45) Date of Patent: May 30, 2023

(54) PRESSURE MEASURING APPARATUS FOR MEASURING A DISCHARGE PRESSURE OF A LIQUID DISCHARGED ONTO A WAFER

(71) Applicant: SAMSUNG ELECTRONICS CO., LTD., Suwon-si (KR)

(72) Inventors: Inho Won, Suwon-si (KR); Minseok Moon, Suwon-si (KR); Byoungkon Park, Suwon-si (KR); Sangho Lee, Suwon-si (KR); Jaewon Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 411 days.

(21) Appl. No.: 16/711,550

(22) Filed: Dec. 12, 2019

(65) Prior Publication Data
US 2020/0370982 A1 Nov. 26, 2020

(30) Foreign Application Priority Data

May 22, 2019 (KR) .......................... 10-2019-0060217

(51) Int. Cl.
*G01L 9/06* (2006.01)
*G01B 17/04* (2006.01)
(Continued)

(52) U.S. Cl.
CPC .............. *G01L 9/065* (2013.01); *G01B 17/04* (2013.01); *G01L 1/18* (2013.01); *G01L 1/205* (2013.01);
(Continued)

(58) Field of Classification Search
CPC ....... G01L 9/065; G01L 19/0092; G01L 1/18; G01L 1/205; G01L 9/0026; G01B 17/04; H01L 21/67253
(Continued)

(56) References Cited

U.S. PATENT DOCUMENTS 4,782,319 A * 11/1988 Dell'Acqua et al. ....................... G01L 9/0055 338/4
4,856,993 A 8/1989 Maness et al.
(Continued)

FOREIGN PATENT DOCUMENTS

EP 0441567 A2 * 8/1991 ............... G07C 9/35
EP 3835746 A1 * 6/2021 ............... G01L 1/14
(Continued)

OTHER PUBLICATIONS

Translation JP-2007093234-A (Year: 2007).*
Translation JP-2001157863-A (Year: 2001).*

*Primary Examiner* — Alexander A Mercado
*Assistant Examiner* — Monica S Young
(74) *Attorney, Agent, or Firm* — Sughrue Mion, PLLC

(57) ABSTRACT

A pressure measuring apparatus for measuring a jetting pressure of a liquid jetted from a nozzle includes a plate including: a first surface facing the nozzle; and a second surface opposite to the first surface; a pressure sensor configured to detect a discharge position and the discharge pressure at the discharge position of the liquid and generate a signal based on the discharge pressure; and electrical components including a controller configured to receive the signal and collect data regarding the discharge pressure. The pressure sensor is provided on the first surface of the plate and the electrical components are provided on the second surface of the plate.

8 Claims, 17 Drawing Sheets

(51) Int. Cl.
  *G01L 19/00* (2006.01)
  *G01L 9/00* (2006.01)
  *G01L 1/20* (2006.01)
  *H01L 21/67* (2006.01)
  *G01L 1/18* (2006.01)
  *G01L 5/00* (2006.01)
(52) U.S. Cl.
  CPC .......... *G01L 5/0076* (2013.01); *G01L 9/0026* (2013.01); *G01L 19/0092* (2013.01); *H01L 21/67253* (2013.01)
(58) Field of Classification Search
  USPC .......................................................... 73/753
  See application file for complete search history.

(56) References Cited

U.S. PATENT DOCUMENTS

| | | | |
|---|---|---|---|
| 5,033,291 A | 7/1991 | Podoloff et al. | |
| 5,505,072 A | 4/1996 | Oreper | |
| 5,756,904 A | 5/1998 | Oreper et al. | |
| 5,905,209 A | 5/1999 | Oreper | |
| 5,989,700 A | 11/1999 | Krivopal | |
| 6,244,121 B1* | 6/2001 | Hunter | G03F 7/707 73/865.9 |
| 6,378,378 B1* | 4/2002 | Fisher | C23C 16/45557 73/754 |
| 6,553,277 B1* | 4/2003 | Yagisawa | H01J 37/32935 700/204 |
| 7,113,179 B2 | 9/2006 | Baker et al. | |
| 7,772,960 B2 | 8/2010 | Baker | |
| 8,558,328 B2 | 10/2013 | Legat et al. | |
| 2004/0031340 A1* | 2/2004 | Renken | H01L 22/34 73/866.1 |
| 2006/0092139 A1* | 5/2006 | Sharma | G06F 3/0412 345/173 |
| 2007/0068263 A1* | 3/2007 | Reinwald | G01L 27/005 73/714 |
| 2007/0097154 A1* | 5/2007 | Kojima | B41J 2/14233 347/1 |
| 2011/0217208 A1* | 9/2011 | Narendrnath | G01F 1/28 422/86 |
| 2015/0101731 A1* | 4/2015 | Hepp | G01L 1/16 156/64 |
| 2016/0247999 A1* | 8/2016 | Aliane | H01L 41/193 |
| 2017/0268941 A1 | 9/2017 | Finlay | |
| 2018/0136762 A1* | 5/2018 | Jeong | G06F 3/0446 |
| 2019/0092016 A1* | 3/2019 | Asaoka | H01L 41/0471 |
| 2019/0377452 A1* | 12/2019 | Routley | G06F 3/0416 |
| 2021/0247255 A1* | 8/2021 | Ogasawara | G01L 19/0038 |

FOREIGN PATENT DOCUMENTS

| | | | |
|---|---|---|---|
| JP | 2001157863 A | * | 6/2001 |
| JP | 2007024633 A | * | 2/2007 |
| JP | 2007093234 A | * | 4/2007 |
| JP | 2007093242 A | * | 4/2007 |
| KR | 10-1511283 B1 | | 4/2015 |
| KR | 10-2015-0109865 A | | 10/2015 |
| KR | 20210103303 A | * | 10/2021 |

* cited by examiner

PRESSURE MEASURING APPARATUS FOR MEASURING A DISCHARGE PRESSURE OF A LIQUID DISCHARGED ONTO A WAFER

CROSS-REFERENCE TO RELATED APPLICATION

This application claims priority from Korean Patent Application No. 10-2019-0060217, filed on May 22, 2019 in the Korean Intellectual Property Office, the disclosure of which is incorporated herein by reference in its entirety.

BACKGROUND

Apparatuses consistent with example embodiments relate to a pressure measuring apparatus, and more particularly, to a pressure measuring apparatus capable of measuring the jetting (or discharge) pressure of a liquid discharged from a nozzle.

In a semiconductor process, a liquid may be sprayed with a certain pressure onto a wafer for various purposes. For example, a liquid may be sprayed onto a wafer to clean impurities on the wafer. When the pressure of the liquid discharged onto the wafer is lower than a reference value or range, impurities on the wafer may not be sufficiently cleaned, thereby inducing quality defects of a semiconductor device. On the other hand, when the pressure of the liquid sprayed onto the wafer is higher than the reference value or range, the pressure of the liquid may damage semiconductor elements formed on the wafer. Therefore, a pressure measuring apparatus capable of precisely measuring the discharge pressure of a liquid discharged from a nozzle is needed.

SUMMARY

One or more example embodiments provide a pressure measuring apparatus capable of precisely measuring the discharge pressure of a liquid discharged from a nozzle.

One or more example embodiments also provide a pressure measuring apparatus that is less likely be short-circuited by a liquid discharged from a nozzle and includes a large pressure sensor.

One or more example embodiments also provide a thin, lightweight, and durable pressure measuring apparatus.

According to an aspect of an example embodiment, there is provided a pressure measuring apparatus for measuring a discharge pressure of a liquid discharged from a nozzle, the pressure measuring apparatus including a plate including: a first surface facing the nozzle; and a second surface opposite to the first surface; a pressure sensor configured to detect a discharge position and the discharge pressure at the discharge position of the liquid and generate a signal based on the discharge pressure; and electrical components including a controller configured to receive the signal and collect data regarding the discharge pressure. The pressure sensor is provided on the first surface of the plate and the electrical components are provided on the second surface of the plate.

According to an aspect of another example embodiment, there is provided a pressure measuring apparatus for measuring a discharge pressure of a liquid discharged from a nozzle, the pressure measuring apparatus including a plate including: a first surface facing the nozzle; and a second surface opposite to the first surface; a pressure sensor configured to detect the discharge pressure and configured to generate a signal based on the discharge pressure; a controller configured to receive the signal and collect data regarding the discharge pressure; a communicator configured to transmit the data to an external device; and a power supply configured to supply power to the pressure measuring apparatus. The pressure sensor is provided on the first surface of the plate and the controller, the communicator, and the power supply are provided on the second surface of the plate. The pressure sensor includes: a sensor board attached onto the first surface of the plate; a first sensor provided on the sensor board; and a second sensor spaced apart from the first sensor to face the first sensor. The signal is generated by the second sensor based on the second sensor being brought into contact with the first sensor by the liquid.

According to an aspect of another example embodiment, there is provided a pressure measuring apparatus for measuring a discharge pressure of a liquid discharged from a nozzle, the pressure measuring apparatus including a plate including a first surface facing the nozzle; a pressure sensor configured to detect the discharge pressure and configured to generate a signal based on the discharge pressure; a controller configured to receive the signal and collect data related the discharge pressure; a communicator configured to transmit the data to an external device; a power supply configured to supply power to the pressure measuring apparatus; and a casing configured to cover the first surface of the plate. The casing is configured to cover the controller, the communicator, and the power supply formed on the first surface of the plate and expose the pressure sensor formed on the first surface of the plate to the outside.

BRIEF DESCRIPTION OF THE DRAWINGS

Example embodiments of the disclosure will be more clearly understood from the following detailed description taken in conjunction with the accompanying drawings in which.

DETAILED DESCRIPTION

Figure 1:
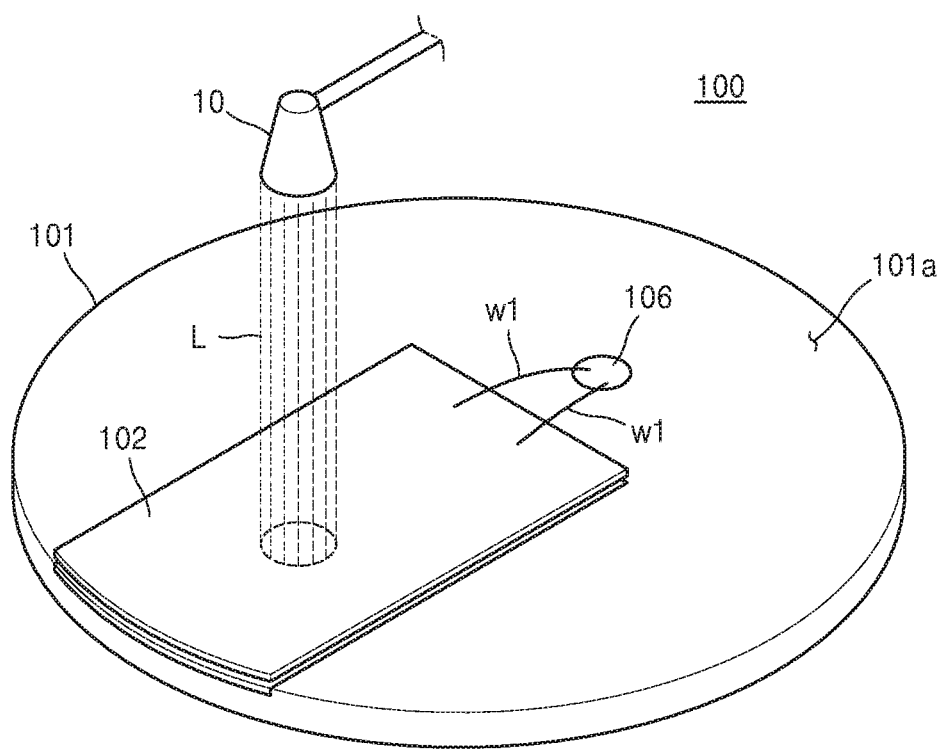
FIG. 1 is a perspective view of a nozzle and a pressure measuring apparatus for measuring the discharge pressure of a liquid discharged from the nozzle according to an example embodiment.

Hereinafter, example embodiments will be described in detail with reference to the accompanying drawings. Like reference numerals are used to refer to like elements through at the drawings, and thus their repetitive description will be omitted.

Figure 2:
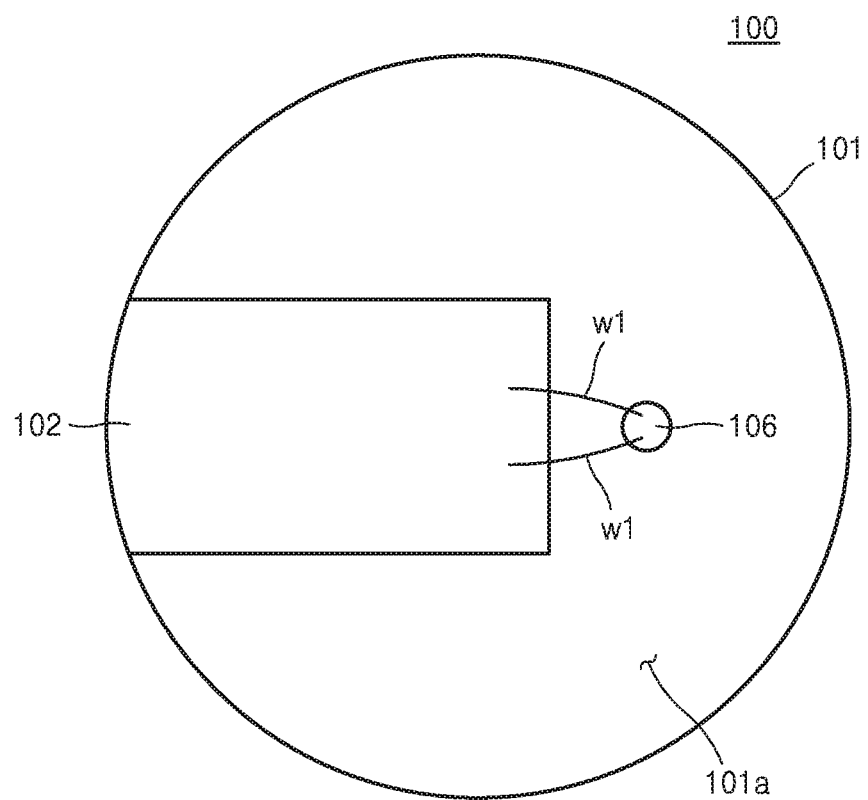
FIG. 2 is a plan view of a pressure measuring apparatus according to an example embodiment.

FIG. 1 is a perspective view of a nozzle 10 and a pressure measuring apparatus 100 for measuring a discharge pressure of a liquid L discharged from the nozzle 10 according to an example embodiment. FIG. 2 is a plan view of a pressure measuring apparatus 100 according to an example embodiment, and FIG. 3 is a bottom view of a pressure measuring apparatus 100 according to an example embodiment.

The pressure measuring apparatus 100 according to an example embodiment may be an apparatus for measuring the jetting pressure (or discharge pressure) of the liquid L discharged (or jetted) from the nozzle 10. For example, the pressure measuring apparatus 100 may be an apparatus for measuring the discharge pressure of various types of the liquid L discharged onto a wafer in a semiconductor processing chamber. The liquid L to be discharged or jetted from the nozzle 10 may include various types of chemical liquids and deionized water used in semiconductor processes.

However, the example embodiment is not limited thereto, and the pressure measuring apparatus 100 may be an apparatus for measuring pressures applied to a wafer by various devices used in semiconductor processes. For example, the pressure measuring apparatus 100 may be an apparatus for measuring the pressure applied by a chemical mechanical polishing (CMP) apparatus to a wafer in a CMP process.

Figure 3:
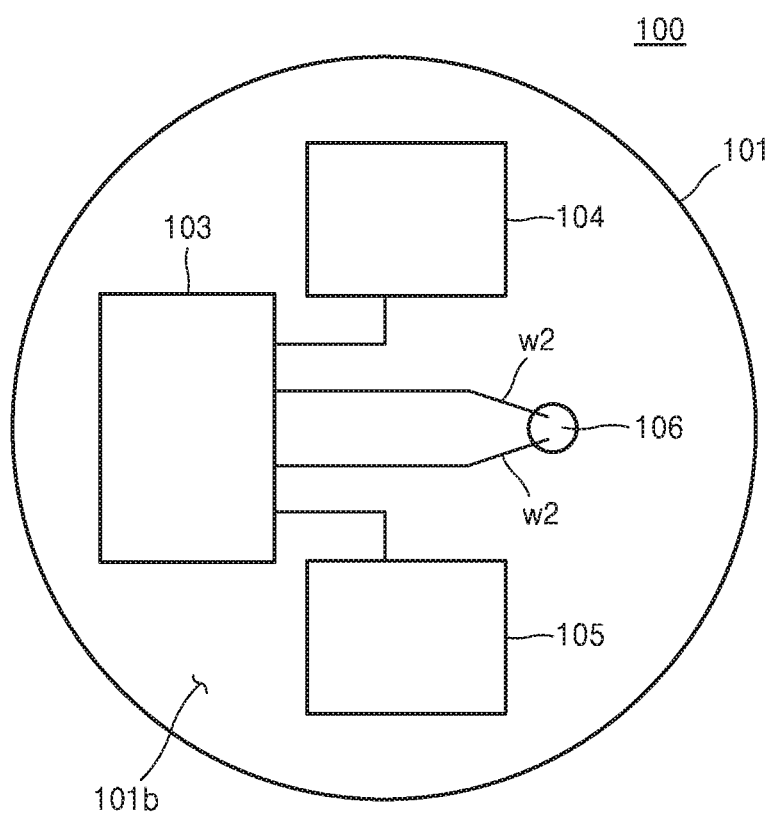
FIG. 3 is a bottom view of a pressure measuring apparatus according to an example embodiment.

Referring to FIGS. 1 to 3, the pressure measuring apparatus 100 may include a first plate 101, a pressure sensor 102, electrical components including a first controller 103, a first communicator 104, and a first power supply 105, and a via electrode 106.

In an example embodiment, the first plate 101 may support components like the pressure sensor 102, the first controller 103, the first communicator 104, and the first power supply 105. The first plate 101 may include a first surface 101a facing the nozzle 10 and a second surface 101b provided opposite to the first surface 101a.

In an example embodiment, the first plate 101 may have a shape similar to that of a wafer on which semiconductor elements are formed. As shown in FIGS. 1 to 3, the first plate 101 may have a disc-like shape. However, the example embodiment is not limited thereto, and the first plate 101 may have various shapes like a rectangular plate and a hexagonal plate.

In an example embodiment, the first plate 101 may be of a size similar to that of the wafer. For example, when the first plate 101 has a disc-like shape, the diameter of the first plate 101 may be from about 5 inches to about 20 inches. In detail, the first plate 101 may have a disc-like shape and a diameter of about 10 inches.

In an example embodiment, the pressure sensor 102 may sense the discharge pressure (or the jetting pressure) of the liquid L that is discharged (or jetted) from the nozzle 10. The pressure sensor 102 may also generate sensed signals based on the intensities of the discharge pressures of the discharged liquid L from the nozzle 10. In detail, the liquid L discharged from the nozzle 10 may exert an external force on the pressure sensor 102 and the pressure sensor 102 may obtain the external force exerted by the discharged liquid L. Depending on the magnitude of the external force exerted by the liquid L discharged from the nozzle 10 to the pressure sensor 102, the pressure sensor 102 may generate different sensed signals. The first controller 103, which will be described below, may receive the sensed signals and collect data related to the intensities of the discharge pressure of the liquid L discharged from the nozzle 10 from the sensed signals.

In an example embodiment, the pressure sensor 102 may sense the discharge positions of the liquid L that is discharged from the nozzle 10. In detail, the liquid L that is discharged from the nozzle 10 may reach the pressure sensor 102 and the pressure sensor 102 is capable of detecting/determining positions at which the discharged liquid L reaches the pressure sensor 102. The pressure sensor 102 may generate sensed signals based on the positions at which the discharged liquid L contacts the pressure sensor 102. The first controller 103, which will be described below, may receive the sensed signals and collect data related to the discharge positions of the liquid L discharged from the nozzle 10 based on the sensed signals.

In an example embodiment, the pressure sensor 102 may detect the discharge positions of the liquid L discharged from the nozzle 10 and may also detect the intensities of the pressure of the discharged liquid L at the discharge positions. For example, a plurality of fine lattices may be formed in the pressure sensor 102. Each of the lattices may generate sensed signals based on the magnitude of external force exerted to the lattices by the discharged liquid L. Therefore, the pressure sensor 102 may accurately measure the discharge positions and the discharge pressure at the discharge positions. The structure and the operation of the pressure sensor 102 will be described in more detail below.

In an example embodiment, the first controller 103 may receive sensed signals related to the discharge positions and the intensities of the discharge pressure at the discharge positions from the pressure sensor 102. Also, the first controller 103 may analyze the sensed signals, determine the discharge positions of the discharged liquid L, and calculate the intensities of the discharge pressure of the discharged liquid L at the discharge positions. Therefore, the first controller 103 may collect data related to the discharge positions and the intensities of the discharge pressure at the discharge positions.

In an example embodiment, when the discharge pressure of the liquid L discharged from the nozzle 10 changes over time, the first controller 103 may also collect data regarding the change of the intensity of the discharge pressure of the discharged liquid L. For example, when the discharge pressure of the liquid L discharged from the nozzle 10 changes over time, the first controller 103 may divide the time during which the liquid L is discharged into a plurality of sections and collect data regarding the intensity of the discharge pressure of the liquid L for each section.

In an example embodiment, the first controller 103 may calibrate data regarding the discharge positions of the discharged liquid L and the intensity of the discharge pressure. In detail, sensed signals transmitted from the pressure sensor 102 to the first controller 103 may be sensitive to various parameters including the temperature of the pressure sensor 102, the temperature of the discharged liquid L, the temperature inside a chamber where the pressure measuring apparatus 100 is located, and the vibration of the first plate 101. Therefore, the first controller 103 may calibrate data regarding the intensities of the discharge pressure of the discharged liquid L by reflecting the values of the various parameters such as the temperature of the pressure sensor 102, the temperature of the discharged liquid L, and the temperature inside a chamber where the pressure measuring apparatus 100 is located.

In an example embodiment, the first communicator 104 may transmit data related to the discharge positions and discharge pressure of the discharged liquid L from the nozzle 10, collected by the first controller 103, to a parent system (or an external system). The parent system may include a display for visually displaying data regarding the discharge positions and the discharge pressure of the discharged liquid L, collected by the first controller 103. The parent system may include a nozzle controller for controlling the discharge pressure of the nozzle 10 based on the data regarding the discharge positions and the discharge pressure of the discharged liquid L, collected by the first controller 103.

In an example embodiment, the first communicator 104 may communicate with the parent system or the external device through wireless communication. For example, the first communicator 104 may communicate with the parent system or the external device through at least one of Wi-Fi, Bluetooth, and infrared communication. However, communication schemes through which the first communicator 104 communicates with the parent system are not limited to those stated above and may include various other schemes.

In an example embodiment, the first power supply 105 may be configured to supply power to the pressure measuring apparatus 100. In detail, the first power supply 105 may supply power to the pressure sensor 102, the first controller 103, and the first communicator 104 of the pressure measuring apparatus 100.

In an example embodiment, the first power supply 105 may be wirelessly charged. For example, the first power supply 105 may be wirelessly charged through magnetic resonance or magnetic induction. However, the example embodiment is not limited thereto, and the first power supply 105 may be charged through a wire or a cord.

In an example embodiment, the pressure sensor 102 may be on the first surface 101a of the first plate 101. Furthermore, except for the pressure sensor 102, the first controller 103, the first communicator 104, and the first power supply 105 may be on the second surface 101b opposite the first surface 101a. Therefore, the pressure sensor 102 may occupy a relatively large area on the first surface 101a of the first plate 101 and thus the pressure sensor 102 may detect the discharged liquid L in a relatively wide area of the first plate 101.

In an example embodiment, except for the pressure sensor 102, the first controller 103, the first communicator 104, and the first power supply 105 may be on the second surface 101b opposite to the first surface 101a of the first plate 101, and thus, the first controller 103, the first communicator 104, and the first power supply 105 may be protected from the liquid L discharged onto the first surface 101a of the first plate 101 and the pressure measuring apparatus 100 may less likely be short-circuited.

In an example embodiment, the via electrode 106 may penetrate through the first plate 101 from the first surface 101a to the second surface 101b of the first plate 101. In detail, the via electrode 106 may be formed by forming a via hole penetrating through the first plate 101 from the first surface 101a to the second surface 101b of the first plate 101 and filling the via hole with a conductive material. However, the example embodiment is not limited thereto, and the via electrode 106 may be formed in the first plate 101 in various other ways.

In an example embodiment, the via electrode 106 may electrically interconnect the pressure sensor 102 and the first controller 103. For example, the pressure sensor 102 and the first controller 103 may be electrically connected to each other via a first connection wire w1 and a second connection wire w2 that are electrically connected to the via electrode 106. In detail, the first connection wire w1 electrically connected to the pressure sensor 102 may be electrically connected to the via electrode 106 on the first surface 101a of the first plate 101. Also, the second connection wire w2 electrically connected to the first controller 103 may be electrically connected to the via electrode 106 on the second surface 101b of the first plate 101. In an example embodiment, at least one of the pressure sensor 102 and the first controller 103 may directly contact the via electrode 106 and may be electrically connected thereto without using a connection wire.

In an example embodiment, the first connection wire w1 may have a structure in which a conductive material is covered with a waterproof material. Therefore, the conductive material of the first connection wire w1 may be protected from the liquid L discharged from the nozzle 10. Also, the second connection wire w2 may also have a structure in which a conductive material is covered with a waterproof material.

In an example embodiment, the pressure measuring apparatus 100 may further include a casing covering the second surface 101b of the first plate 101. In detail, the casing may be coupled with the first plate 101 and cover the second surface 101b of the first plate 101. The casing may cover the first controller 103, the first communicator 104, and the first power supply 105 on the second surface 101b of the first plate 101. When the casing is formed to cover the second surface 101b of the first plate 101, the first controller 103, the first communicator 104, and the first power supply 105 may not be exposed to the exterior, and thus, the first controller 103, the first communicator 104, and the first power supply 105 may be further protected from the discharged liquid L.

In an example embodiment, the pressure measuring apparatus 100 may further include a check valve formed at the casing. The check valve may control the inflow of a gas into the casing. Therefore, the first controller 103, the first communicator 104, and the first power supply 105 formed on the second surface 101b of the first plate 101 may be more safely protected from the discharged liquid L.

Figure 4:
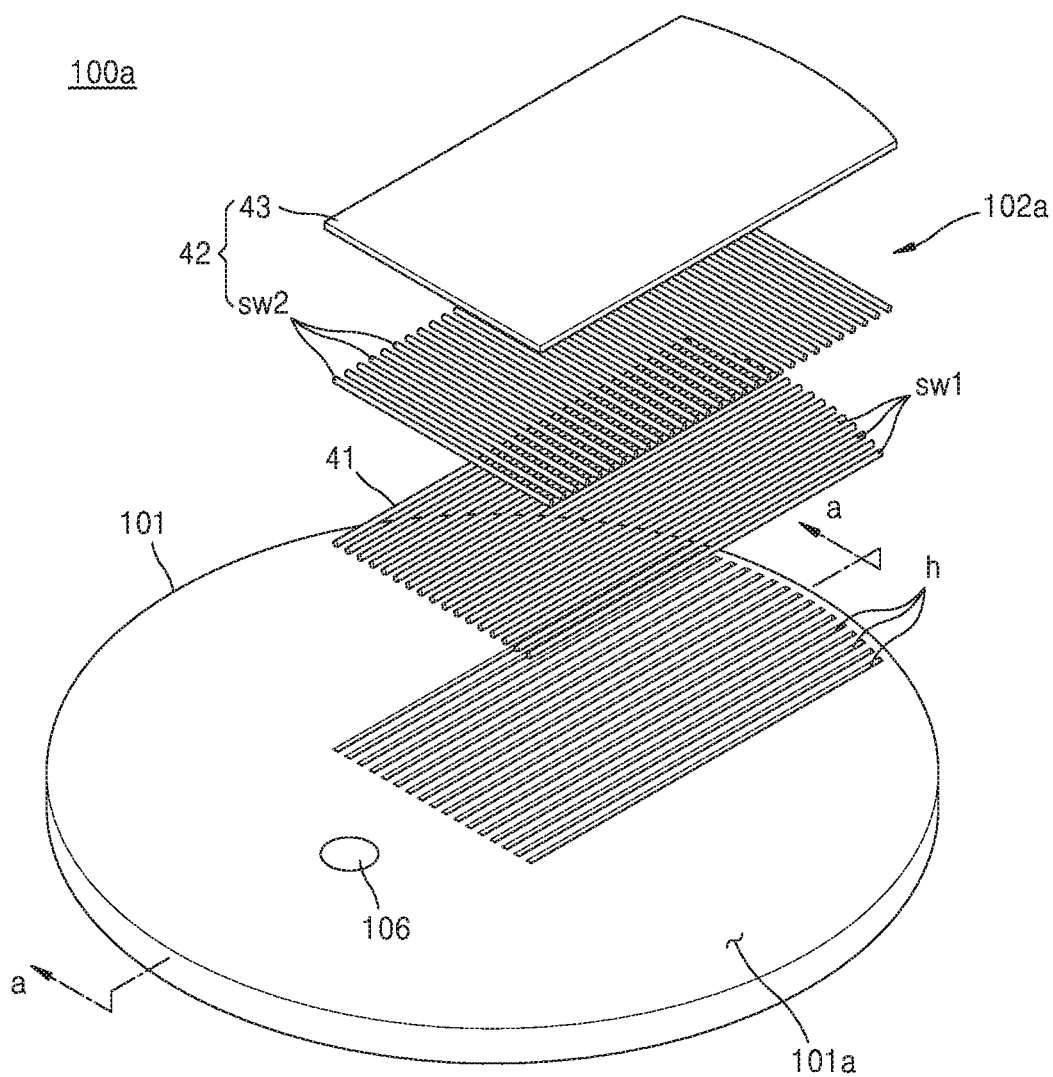
FIG. 4 is an exploded view of a first pressure sensor of a first pressure measuring apparatus according to an example embodiment.
Figure 5:
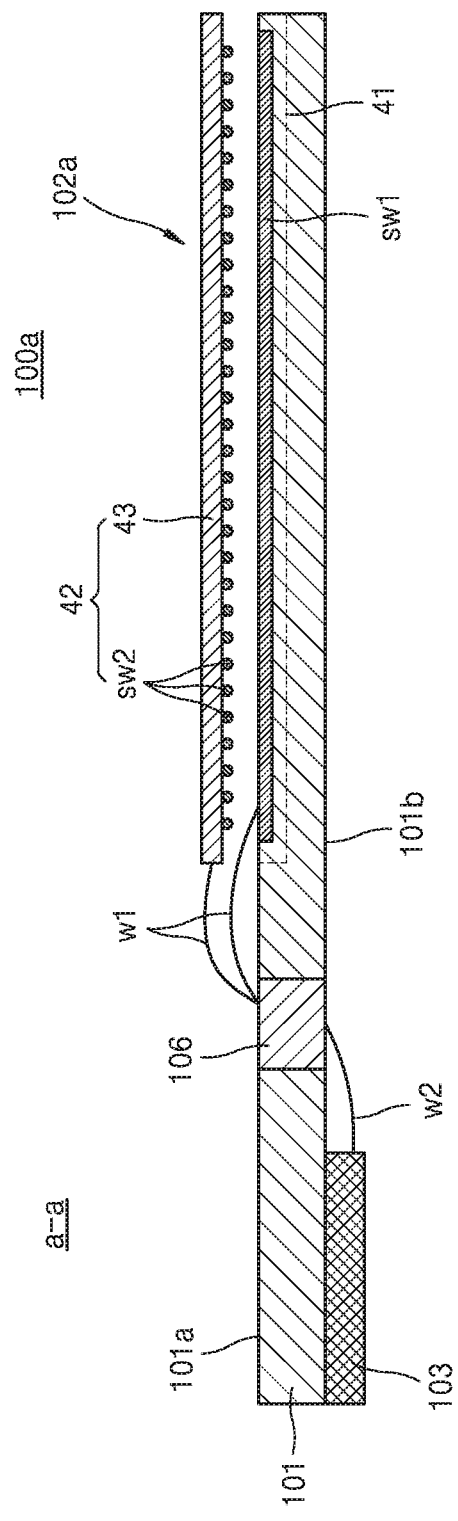
FIG. 5 is a perspective view of the first pressure sensor of the first pressure measuring apparatus according to an example embodiment in an assembled state.

FIG. 4 is an exploded view of a first pressure sensor 102a of a first pressure measuring apparatus 100a according to an example embodiment, and FIG. 5 is a cross-sectional view of the first pressure sensor 102a of a first pressure measuring apparatus 100a according to an example embodiment. In an example embodiment, the pressure measuring apparatus 100 described above with reference to FIGS. 1 to 3 may include the first pressure measuring apparatus 100*a* shown in FIGS. 4 and 5.

In an example embodiment, the first pressure measuring apparatus 100*a* may include the first plate 101, the first pressure sensor 102*a*, the first controller 103, the first communicator 104, the first power supply 105, and the via electrode 106. Because the technical features of the first plate 101, the first controller 103, the first communicator 104, the first power supply 105, and the via electrode 106 of the first pressure measuring apparatus 100*a* are identical to those described above with reference to FIGS. 1 to 3, detailed descriptions thereof will be omitted. Also, the technical feature of the first pressure sensor 102*a* may include the technical feature of the pressure sensor 102 described above.

Referring to FIGS. 4 and 5, the first pressure sensor 102*a* of the first pressure measuring apparatus 100*a* may include a first sensor 41 and a second sensor 42 that is spaced apart from the first sensor 41 to face the first sensor 41.

In an example embodiment, the first sensor 41 may be formed on the first surface 101*a* of the first plate 101. In addition, the first sensor 41 may include a first sensing wire sw1 formed on the first surface 101*a* of the first plate 101. In detail, the first sensing wire sw1 may be inserted into a groove h formed by etching the first surface 101*a* of the first plate 101. Here, the first plate 101 may include a wafer. For example, the first plate 101 may include a silicon wafer. In detail, after the groove h is formed on the first surface 101*a* of the first plate 101 by etching the first plate 101, the first sensor 41 may be formed by inserting the first sensing wire sw1 into the groove h. Because the first plate 101 may include a wafer, the groove h may be easily formed, and the first sensing wire sw1 may be firmly positioned in the groove h. When the first sensing wire sw1 is in the groove h, a portion of the surface of the first sensing wire sw1 may be exposed to the outside.

In an example embodiment, the second sensor 42 may be formed to be spaced apart from the first sensor 41 to face the first sensor 41 in a thickness direction of the first plate 101. The liquid (L of FIG. 1) discharged from a nozzle (10 of FIG. 1) may reach the second sensor 42, and at least one region of the second sensor 42 may contact the first sensor 41 due to an external force exerted on the second sensor 42 by the liquid L. When the one region of the second sensor 42 contacts the first sensor 41, the first pressure sensor 102*a* may generate sensed signals related to the discharge positions of the discharged liquid L and the discharge pressure at the discharge positions. The first pressure sensor 102*a* may generate different sensed signals when the discharge positions and discharge pressures of the discharged liquid L change in time.

In an example embodiment, the second sensor 42 may include a first flexible substrate 43 and a second sensing wire sw2 formed on the first flexible substrate 43. In detail, the first flexible substrate 43 may include a flexible printed circuit board. Because the second sensor 42 may include the first flexible substrate 43, one region of the second sensor 42 being contacted by the discharged liquid L may contact the first sensing wire sw1 of the first sensor 41, and the other regions of the second sensor 42 not being contacted by the discharged liquid L may not contact the first sensing wire sw1 of the first sensor 41.

In an example embodiment, second sensing wires sw2 may be arranged on the first flexible substrate 43 in a direction perpendicular to the direction in which first sensing wires sw1 are arranged as shown in FIG. 4. Because the first sensing wires sw1 and the second sensing wires sw2 may be arranged in directions perpendicular to each other, when the first pressure sensor 102*a* is viewed from above, a plurality of fine-sized lattices may be formed. Also, sensed signals regarding the discharge pressure of the discharged liquid L may be generated by the lattices, respectively. The sensed signals generated by the lattices of the first pressure sensor 102*a* may be transmitted to the first controller 103, and the first controller 103 may analyze the sensed signals generated by the lattices and collect data related to the intensities of the discharge pressure of the liquid L discharged from the nozzle 10. Because the first sensing wire sw1 and the second sensing wire sw2 may constitute a plurality of fine lattices, the surface pressure of the first pressure sensor 102*a* due to the discharged liquid L may be accurately measured.

In an example embodiment, the first sensing wire sw1 and the second sensing wire sw2 may include a piezo-resistive material. Also, each of the first sensing wire sw1 and the second sensing wire sw2 may have the shape of a wire extending in one direction.

Referring to FIG. 5, the first sensor 41 and the second sensor 42 may be electrically connected to the first controller 103 via the via electrode 106. For example, the first sensor 41 and the second sensor 42 may be electrically connected to the via electrode 106 through the first connection wire w1, and the first controller 103 may be electrically connected to the via electrode 106 through the second connection wire w2. Therefore, sensed signals generated by the first pressure sensor 102*a* may be transmitted to the first controller 103 via the via electrode 106.

In an example embodiment, the first plate 101 may include a wafer, and the first sensing wire sw1 may be inserted into the groove h formed in the first surface 101*a* of the first plate 101, and thus, the first pressure measuring apparatus 100*a* may be formed. Therefore, the first pressure measuring apparatus 100*a* may not need a separate flexible substrate supporting the first sensing wire sw1 and may be thinner and lighter than a second pressure measuring apparatus 100*b* to be described below with reference to FIGS. 6 and 7.

However, the example embodiment is not limited thereto. In an example embodiment, the first sensor 41 formed on the first plate 101 may include the first sensing wire sw1 and the second sensing wire sw2. Also, the second sensor 42 may include a piezo-resistive material in a surface facing the first sensor 41.

In detail, the first sensing wire sw1 and the second sensing wire sw2 may be inserted into grooves h formed in the first surface 101*a* of the first plate 101 through etching. For example, the first sensing wire sw1 and the second sensing wire sw2 may be inserted into the grooves h, such that the first sensing wire sw1 and the second sensing wire sw2 are arranged in directions perpendicular to each other. Here, the first plate 101 may include a wafer.

In an example embodiment, the first sensing wire sw1 and the second sensing wire sw2 may constitute a plurality of fine lattices on the first surface 101*a* of the first plate 101. When the piezo-electric resistive material of the second sensor 42 physically contacts the lattices due to the discharged liquid L, the first sensor 41 and the second sensor 42 may accurately measure the discharge pressure of the discharged liquid L.

Figure 6:
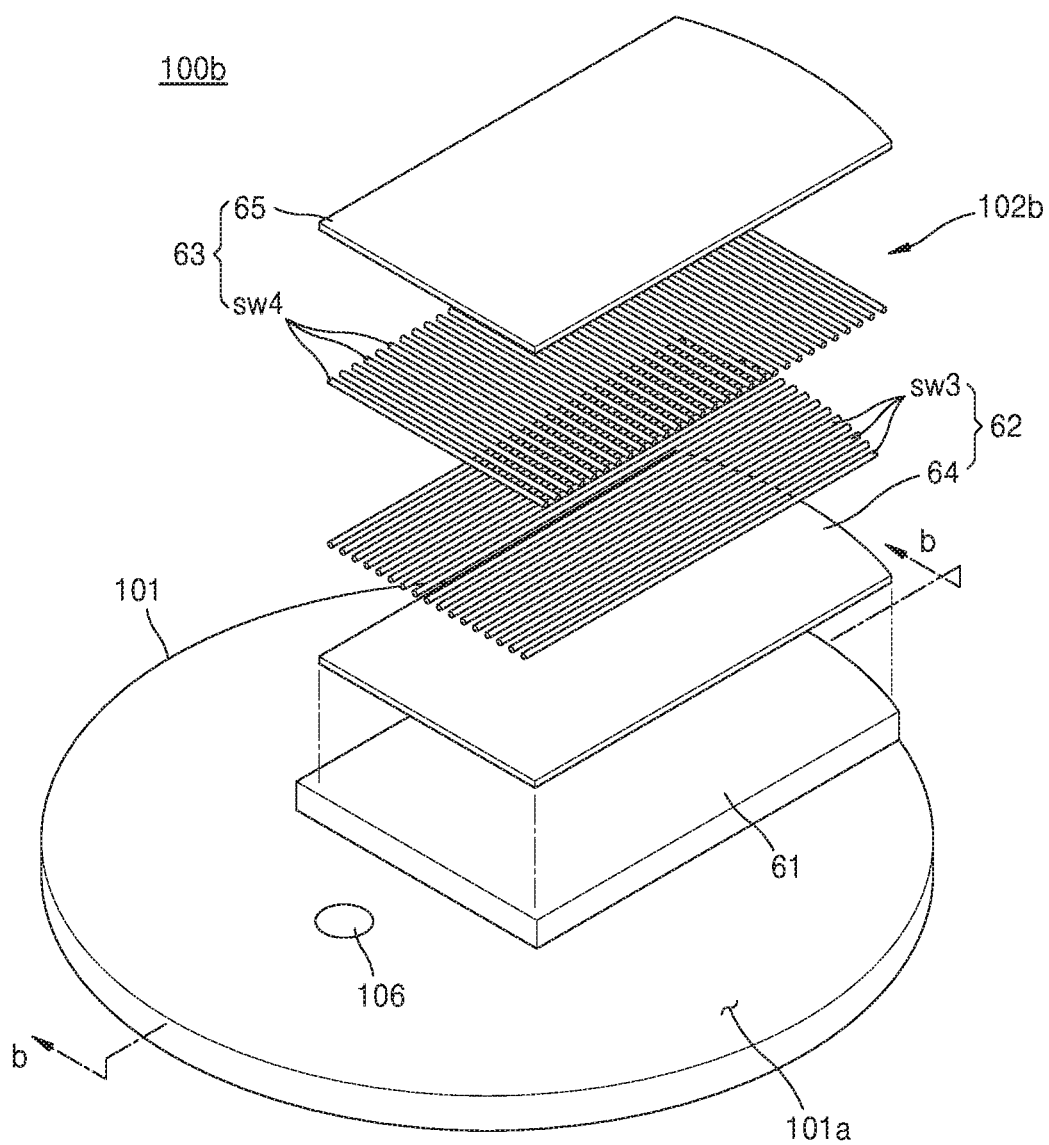
FIG. 6 is an exploded view of a second pressure sensor of a second pressure measuring apparatus according to an example embodiment.
Figure 7:
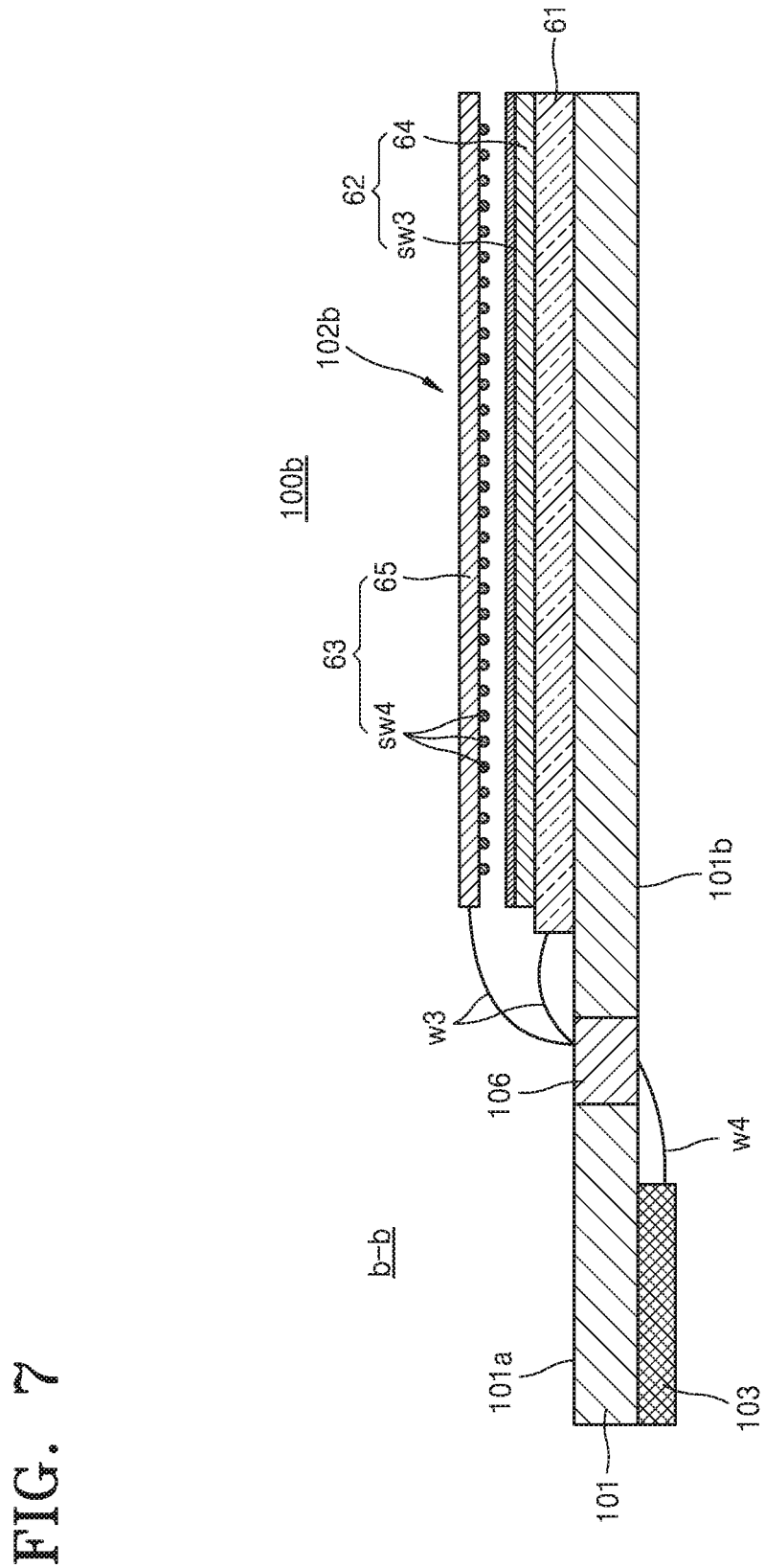
FIG. 7 is a perspective view of the second pressure sensor of the second pressure measuring apparatus according to an example embodiment in an assembled state.

FIG. 6 is an exploded view of a second pressure sensor 102*b* of a second pressure measuring apparatus 100*b* according to an example embodiment, and FIG. 7 is a cross-sectional view of the second pressure sensor 102*b* of the second pressure measuring apparatus 100b according to an example embodiment. In an example embodiment, the pressure measuring apparatus 100 described above with reference to FIGS. 1 to 3 may include the second pressure measuring apparatus 100b.

In an example embodiment, the second pressure measuring apparatus 100b may include the first plate 101, the second pressure sensor 102b, the first controller 103, the first communicator 104, the first power supply 105, and the via electrode 106. Because the technical features of the first plate 101, the first controller 103, the first communicator 104, the first power supply 105, and the via electrode 106 of the second pressure measuring apparatus 100b are identical to those described above with reference to FIGS. 1 to 3, detailed descriptions thereof will be omitted. Also, the technical feature of the second pressure sensor 102b may include the technical feature of the pressure sensor 102 described above.

Referring to FIGS. 6 and 7, the second pressure sensor 102b of the second pressure measuring apparatus 100b may include a first sensor board 61, a third sensor 62, and a fourth sensor 63.

In an example embodiment, a first sensor board 61 may be attached on the first surface 101a of the first plate 101. The first sensor board 61 may be electrically connected to the third sensor 62 and the fourth sensor 63. When the third sensor 62 and the fourth sensor 63 physically contact each other by the discharged liquid L, the first sensor board 61 may generate sensed signals. Also, the first sensor board 61 may transmit generated sensed signals to the first controller 103 via the via electrode 106.

In an example embodiment, the third sensor 62 may be on the first sensor board 61. The third sensor 62 may also include a second flexible substrate 64 provided on the first sensor board 61 and third sensing wires sw3 arranged in one direction on the second flexible substrate 64. For example, the second flexible substrate 64 of the third sensor 62 may include a flexible printed circuit board. Also, the third sensing wires sw3 may be attached to the second flexible substrate 64, and portions of the surfaces of the third sensing wire sw3 may be exposed to the outside.

In an example embodiment, the fourth sensor 63 may be formed to be spaced apart from the third sensor 62 to face the third sensor 62. The liquid (L of FIG. 1) discharged from a nozzle (10 of FIG. 1) may reach the fourth sensor 63, and at least one region of the fourth sensor 63 may contact the third sensor 62 due to an external force exerted on the fourth sensor 63 by the liquid L. When the at least one region of the fourth sensor 63 contacts the third sensor 62, the second pressure sensor 102b may generate sensed signals regarding the discharge positions of the discharged liquid L and the discharge pressure at the discharge positions. The second pressure sensor 102b may generate different sensed signals when the discharge positions and discharge pressures of the discharged liquid L change in time.

In an example embodiment, the fourth sensor 63 may include a third flexible substrate 65 and fourth sensing wires sw4 arranged in one direction on the third flexible substrate 65. In detail, the third flexible substrate 65 may include a flexible printed circuit board. Because the fourth sensor 63 may include the third flexible substrate 65, one region of the fourth sensor 63 being contacted by the discharged liquid L may contact the third sensing wire sw3 of the third sensor 62, and the other regions of the fourth sensor 63 not being contacted by the discharged liquid L may not contact the third sensing wire sw3 of the third sensor 62.

In an example embodiment, fourth sensing wires sw4 may be arranged on the third flexible substrate 65 of the fourth sensor 63 in a direction perpendicular to the direction in which the third sensing wires sw3 are arranged. Because the third sensing wires sw3 and the fourth sensing wires sw4 may be arranged in directions perpendicular to each other, when the second pressure sensor 102b is viewed from above, a plurality of fine-sized lattices may be formed at the second pressure sensor 102b. Sensed signals regarding the discharge pressure of the discharged liquid L may be generated by the lattices of the second pressure sensor 102b, respectively. Different sensed signals generated by the lattices of the second pressure sensor 102b may be transmitted to the first controller 103, and the first controller 103 may analyze the sensed signals generated by the lattices and collect data regarding the intensities of the discharge pressure of the liquid L discharged from the nozzle 10. Because the third sensing wire sw3 and the fourth sensing wire sw4 may constitute a plurality of fine lattices, the surface pressure of the second pressure sensor 102b due to the discharged liquid L may be precisely measured.

Referring to FIG. 7, the second pressure sensor 102b may be electrically connected to the first controller 103 via the via electrode 106. For example, the first sensor board 61 electrically connected to the third sensor 62 and the fourth sensor 63 may be electrically connected to the via electrode 106 through a third connection wire w3, and the first controller 103 may be electrically connected to the via electrode 106 through a fourth connection wire w4. Therefore, sensed signals generated by the second pressure sensor 102b may be transmitted to the first controller 103 via the via electrode 106.

However, the example embodiment is not limited thereto. In an example embodiment, the third sensor 62 on the first sensor board 61 may include the third sensing wires sw3 and the fourth sensing wires sw4. Also, the fourth sensor 63 may include a piezo-resistive material in a surface facing the third sensor 62.

In detail, the third sensing wires sw3 and the fourth sensing wires sw4 may be formed by being attached to the second flexible substrate 64 of the third sensor 62. At this time, portions of the surfaces of the third sensing wires sw3 and the fourth sensing wires sw4 may be exposed to the outside. For example, the third sensing wires sw3 and the fourth sensing wires sw4 may be formed by being attached to the second flexible substrate 64, such that the third sensing wires sw3 and the fourth sensing wires sw4 are arranged in directions perpendicular to each other.

In an example embodiment, the third sensing wires sw3 and the fourth sensing wires sw4 may constitute a plurality of fine lattices on the third sensor 62. When the piezo-electric resistive material of the fourth sensor 63 physically contacts the lattices due to the discharged liquid L, the third sensor 62 and the fourth sensor 63 may precisely measure the discharge pressure of the discharged liquid L.

Figure 8:
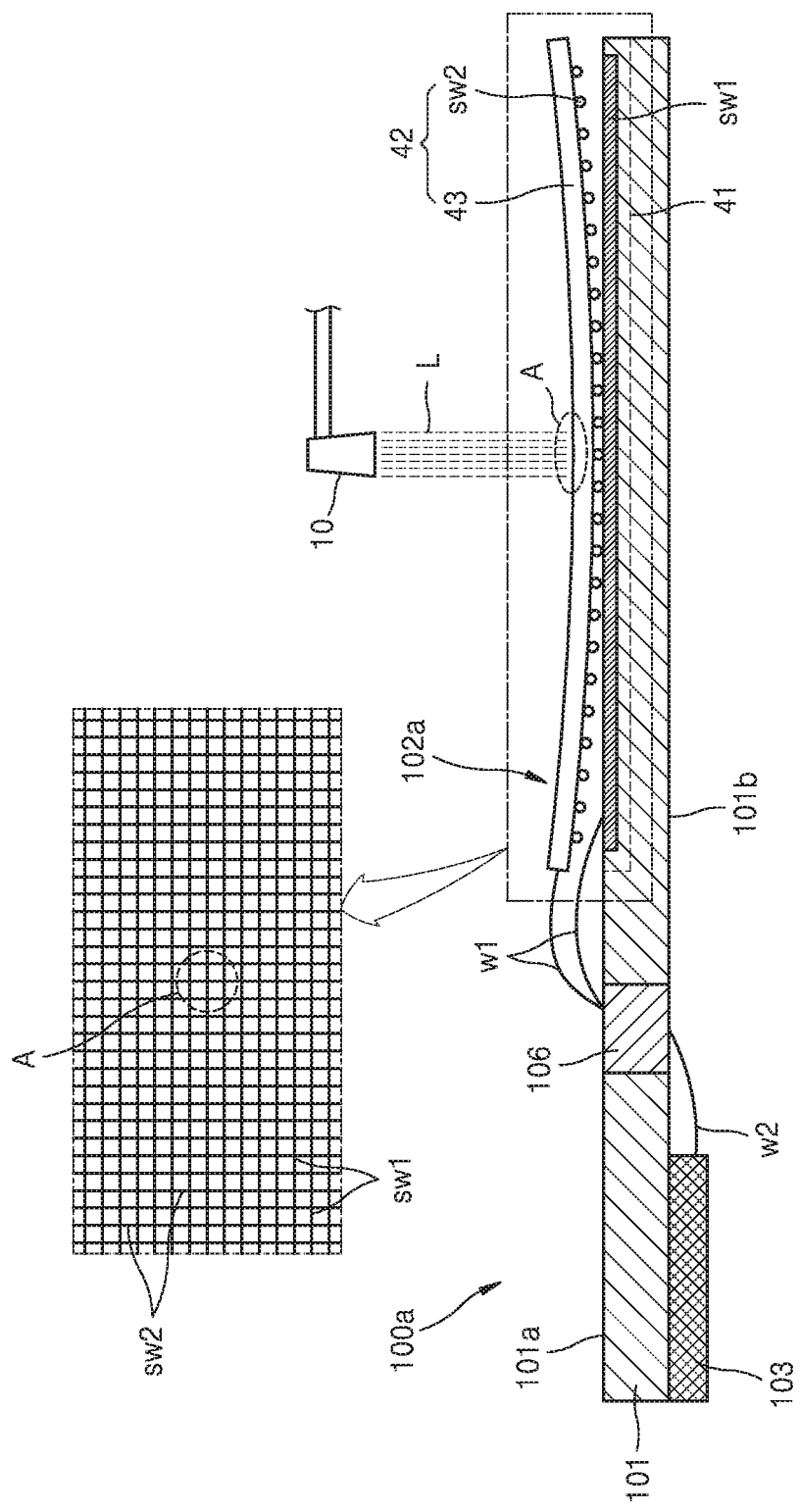
FIG. 8 is a diagram showing an operation for measuring the discharge pressure of a discharged liquid through the first pressure measuring apparatus according to an example embodiment.

FIG. 8 is a diagram showing an operation for measuring the discharge pressure of discharged liquid L through the first pressure measuring apparatus 100a according to an example embodiment.

Referring to FIG. 8, when the liquid L discharged from the nozzle 10 contacts the second sensor 42 of the first pressure sensor 102a, a portion of the first flexible substrate 43 of the second sensor 42 being pushed down by the liquid L may be bent downward and contact the first sensor 41. In detail, a region the first flexible substrate 43 of the second sensor 42 in which the discharged liquid L makes contact with the first flexible substrate 43 may be defined as a discharge region A.

The discharge region A and the second sensor 42 in a region adjacent to the discharge region A may be bent downward by the external force exerted on the first flexible substrate 43 by the discharged liquid L and contact the first sensor 41.

In an example embodiment, the first flexible substrate 43 may be a flexible circuit substrate including a flexible material. Therefore, when the liquid L is discharged from the nozzle 10, the first flexible substrate 43 may be bent downward. Also, when the liquid L is not discharged from the nozzle 10, the first flexible substrate 43 may be restored to its original state (i.e., a flat state) and have a flat plate-like shape. At this time, the second sensor 42 may be spaced apart from the first sensor 41. Because the first flexible substrate 43 may include a flexible circuit board, the second sensor 42 may be durable and may less likely be damaged by the discharged liquid L.

In an example embodiment, the discharge pressure of the liquid L discharged from the nozzle 10 may be selected differently depending on the type of a semiconductor process, the type of the discharged liquid L, etc. The discharge region A and a region adjacent to the discharge region A of the second sensor 42 may reach the first sensor 41 by the external force of different magnitudes according to the intensities of the discharge pressure of the liquid L. The first pressure sensor 102a may generate sensed signals based on the magnitudes of the external force by which the discharge region A and the second sensor 42 in the region adjacent to the discharge region A contacts the first sensor 41 and transmit the sensed signals to the first controller 103 accordingly.

In an example embodiment, as described above, when the first pressure sensor 102a is viewed from above, the first sensing wires sw1 of the first sensor 41 and the second sensing wires sw2 of the second sensor 42 may constitute a plurality of lattices on the first pressure sensor 102a. As the first sensing wires sw1 and the second sensing wires sw2 are densely arranged, the lattices may be formed in a fine size. Sensed signals may be respectively generated by the lattices based on the discharge positions of the discharged liquid L. The first pressure sensor 102a may also generate sensed signals based on the intensities of the jet pressures of the discharged liquid L.

In an example embodiment, a method of measuring the discharge pressure of the discharged liquid L through the second pressure measuring apparatus 100b shown in FIGS. 6 and 7 may be substantially the same as the technical idea described above with reference to FIG. 8, and thus detailed descriptions thereof will be omitted.

Figure 9:
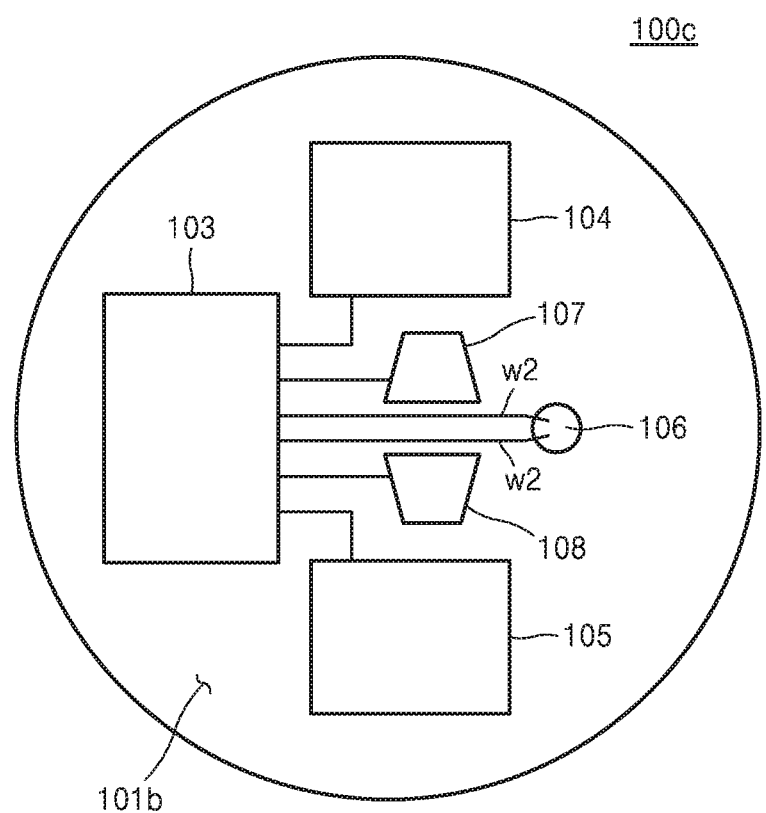
FIG. 9 is a bottom view of a third pressure measuring apparatus according to an example embodiment.

FIG. 9 is a bottom view of a third pressure measuring apparatus 100c according to an example embodiment. The third pressure measuring apparatus 100c may include the first plate 101, the pressure sensor 102, the first controller 103, the first communicator 104, the first power supply 105, the via electrode 106, a first temperature sensor 107, and a first shock sensor 108. Because the technical features of the first plate 101, the first controller 103, the first communicator 104, the first power supply 105, and the via electrode 106 may be substantially identical to those described above with reference to FIGS. 1 to 3. Also, the first pressure measuring apparatus 100a and the second pressure measuring apparatus 100b described above may each include at least one of the first temperature sensor 107 and the first shock sensor 108 described below.

In an example embodiment, the first temperature sensor 107 may include sensors capable of measuring at least one of the temperature of the pressure sensor 102, the temperature of the liquid L discharged from the nozzle 10, and the temperature inside a chamber in which the third pressure measuring apparatus 100c is located.

In detail, sensed signals regarding the discharge pressure of the discharged liquid L generated by the pressure sensor 102 may be sensitive to the temperature of the discharged liquid L, the temperature of the pressure sensor 102, and the temperature inside the chamber in which the third pressure measuring apparatus 100c is located. The first temperature sensor 107 may transmit sensed signals regarding measured temperatures to the first controller 103, and the first controller 103 may correct data regarding the discharge pressure of the discharged liquid L based on transmitted sensed signals regarding temperatures. Therefore, the third pressure measuring apparatus 100c may precisely measure the discharge pressure of the liquid L.

In an example embodiment, the first shock sensor 108 may include sensors capable of detecting deformation of the first plate 101 by the liquid L discharged from the nozzle 10. For example, the first shock sensor 108 may detect information regarding the vibration of the first plate 101 due to the discharged liquid L and may also detect information regarding the warpage of the first plate 101 due to the discharged liquid L. For example, the first shock sensor 108 may include at least any one of an acceleration sensor, a velocity sensor, and a vibration sensor. However, the example embodiment is not limited thereto, and the first shock sensor 108 may include various other sensors to detect the deformation of the first plate 101.

In detail, the sensed signals regarding the discharge pressure of the discharged liquid L generated by the pressure sensor 102 may be sensitive to the vibration and the warpage of the first plate 101 due to the discharged liquid L. The first shock sensor 108 may transmit sensed signals regarding the vibration and the warpage of the first plate 101 to the first controller 103, and the first controller 103 may correct data regarding the intensities of the discharge pressure of the discharged liquid L based on the sensed signals regarding the vibration and the warpage. Therefore, the third pressure measuring apparatus 100c may precisely measure the discharge pressure of the liquid L.

In an example embodiment, the first temperature sensor 107 and the first shock sensor 108 may be formed on the second surface 101b of the first plate 101. Therefore, the first temperature sensor 107 and the first shock sensor 108 may less likely be short-circuited by the discharged liquid L. Also, the first temperature sensor 107 and the first shock sensor 108 may be easily electrically connected to the first controller 103 on the second surface 101b of the first plate 101.

Figure 10:
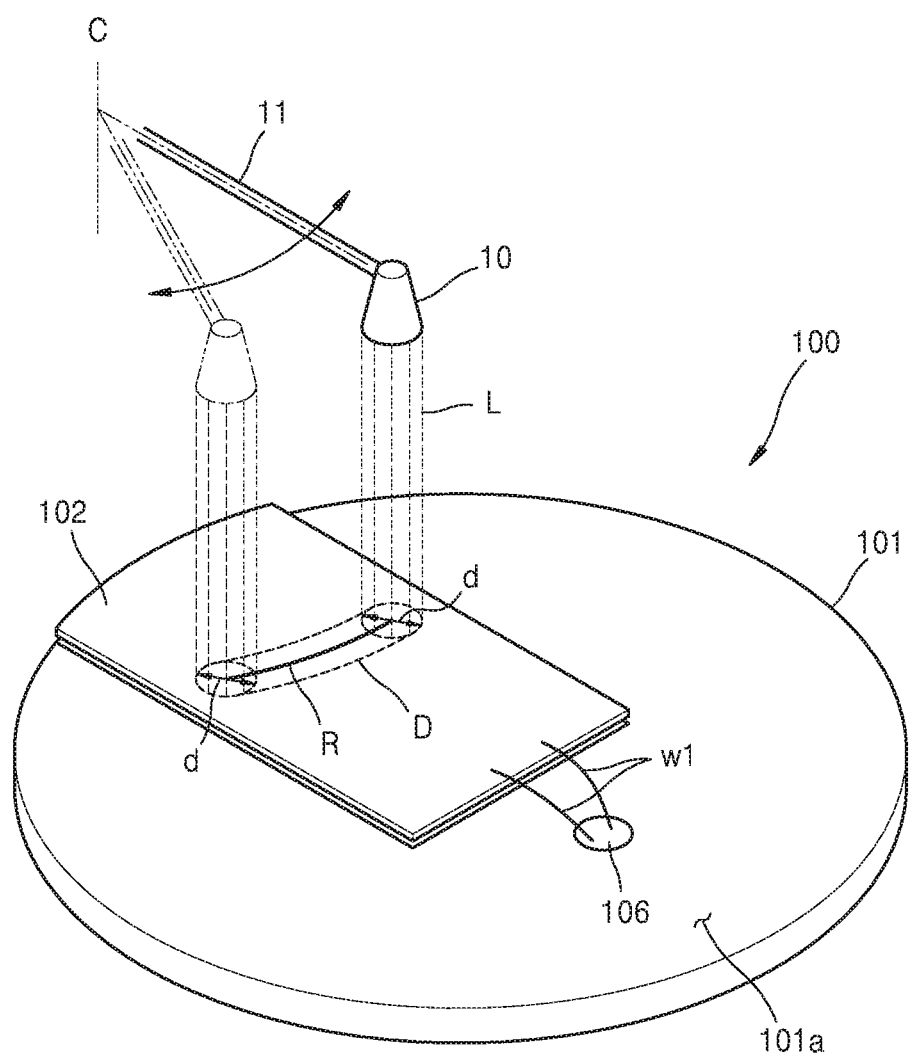
FIG. 10 is a perspective view of a nozzle discharging a liquid onto a first plate and a pressure measuring apparatus for measuring the discharge pressure of a liquid discharged from the nozzle according to an example embodiment.

FIG. 10 is a perspective view of a nozzle 10 discharging a liquid L onto a first plate 101 and the pressure measuring apparatus 100 for measuring the discharge pressure of the liquid L discharged from the nozzle 10 according to an example embodiment. As described above with reference to FIGS. 1 to 3, the pressure measuring apparatus 100 may be an apparatus for measuring the pressure of the liquid L discharged from the nozzle 10.

In an example embodiment, the nozzle 10 may be coupled with a nozzle arm 11 extending from a rotation shaft C. Also, the nozzle arm 11 may rotate about the rotation shaft C. Therefore, the nozzle 10 may discharge the liquid L onto the pressure sensor 102 while rotating with respect to the rotation shaft C.

In an example embodiment, when the pressure sensor 102 and the nozzle 10 are viewed from above, the liquid L discharged from the nozzle 10 may reach the first surface 101a of the first plate 101 in the shape of a circle having a first diameter d. Also, when the pressure sensor 102 is viewed from above, according to the rotation of the nozzle 10, the discharged liquid L may draw a discharge trail Ron the first surface 101*a* of the first plate 101. For example, the discharged trail R drawn by the discharged liquid L may have the shape of an arc. However, the example embodiment is not limited thereto, and the discharged liquid L may be discharged onto the pressure sensor 102 with various types of trails. Also, when the nozzle 10 discharges the liquid L along the discharge trail R, the total sum of discharge surfaces formed by the discharged liquid L on the first surface 101*a* may be defined as a discharge effective surface D.

In an example embodiment, the discharge trail R that the nozzle 10 draws on the first surface 101*a* of the first plate 101 may be within a region formed by the pressure sensor 102. The discharge effective surface D formed by the discharged liquid L on the first surface 101*a* may also be within a surface formed by the pressure sensor 102.

In an example embodiment, as described above, the pressure sensor 102 may include a plurality of fine lattices, and a surface formed by the lattices may include the discharge trail R. For example, the centers of the plurality of lattices may be located on the discharge trail R.

Unlike as shown in FIG. 10, the pressure sensor 102 may be formed in a shape similar to the shape of the discharge effective surface D. For example, when the discharge trail R has the shape of an arc and the discharge effective surface D has a bent shape according to the shape of the discharge trail R, the pressure sensor 102 may have a bent shape similar to that of the discharge effective surface D. The size of the pressure sensor 102 may be larger than that of the discharge effective surface D. However, the example embodiment is not limited thereto, and the size of the pressure sensor 102 may be substantially the same as that of the discharge effective surface D. The pressure sensor 102 may be formed on the first surface 101*a* of the first plate 101 in a shape similar to the shape of the discharge effective surface D formed by the discharged liquid L, and thus the pressure sensor 102 may precisely measure the discharge pressure of the discharged liquid L according to the discharge positions. Also, the cost for manufacturing the pressure sensor 102 may be reduced.

Figure 11:
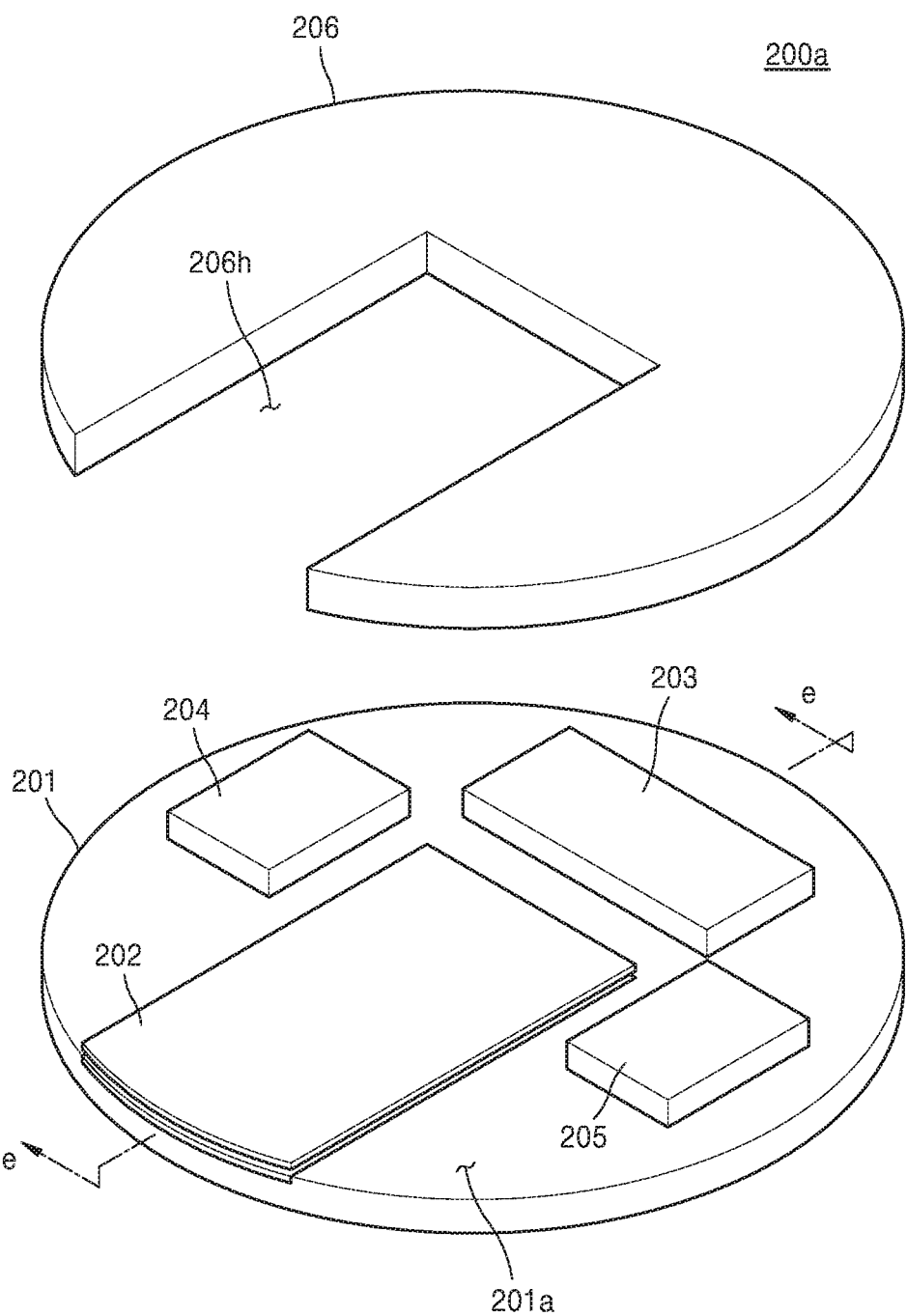
FIG. 11 is an exploded view of a fourth pressure measuring apparatus according to an example embodiment.

FIG. 11 is an exploded view of a fourth pressure measuring apparatus 200*a* according to an example embodiment. The fourth pressure measuring apparatus 200*a* may be an apparatus for measuring the discharge pressure of the liquid L discharged from the nozzle 10. In an example embodiment, the fourth pressure measuring apparatus 200*a* may include a second plate 201, a pressure sensor 202, a second controller 203, a second communicator 204, a second power supply 205, and a casing 206.

The technical features of the second plate 201, the pressure sensor 202, the second controller 203, the second communicator 204, and the second power supply 205 of the fourth pressure measuring apparatus 200*a* may be substantially the same as the technical features of the first plate 101, the pressure sensor 102, the first controller 103, and the first communicator 104 and the first power supply 105 described above with reference to FIGS. 1 to 3, and thus detailed descriptions thereof will be omitted.

However, the pressure sensor 202, the second controller 203, the second communicator 204, and the second power supply 205 of the fourth pressure measuring apparatus 200*a* may be provide on a first surface 201*a*, which is a surface of the second plate 201 facing the nozzle 10. In other words, the pressure sensor 202, the second controller 203, the second communicator 204, and the second power supply 205 may be provided on the same surface of the second plate 201.

In an example embodiment, the casing 206 of the fourth pressure measuring apparatus 200*a* may be combined with the second plate 201 and cover the first surface 201*a* of the second plate 201. In detail, the casing 206 may cover the second controller 203, the second communicator 204, and the second power supply 205 formed on the first surface 201*a* of the second plate 201. Therefore, the second controller 203, the second communicator 204, and the second power supply 205 may not be exposed to the exterior.

In an example embodiment, an opening 206*h* may be formed in the casing 206. When the casing 206 is combined with the second plate 201, the pressure sensor 202 may be exposed through the opening 206*h*. In other words, when the third pressure measuring apparatus 100*c* is viewed from the outside, the pressure sensor 202 may be seen.

The pressure sensor 202 of the fourth pressure measuring apparatus 200*a* may be exposed to the outside through the opening 206*h* of the casing 206, and thus, the third pressure measuring apparatus 100*c* may detect the discharge pressure of the liquid L discharged from the nozzle 10 through the pressure sensor 202. Also, the second controller 203, the second communicator 204, and the second power supply 205 of the fourth pressure measuring apparatus 200*a* may be covered by the casing 206 and not exposed to the outside, and thus, the second controller 203, second communicator 204, and second power supply 205 may be protected from the discharged liquid L.

Figure 12:
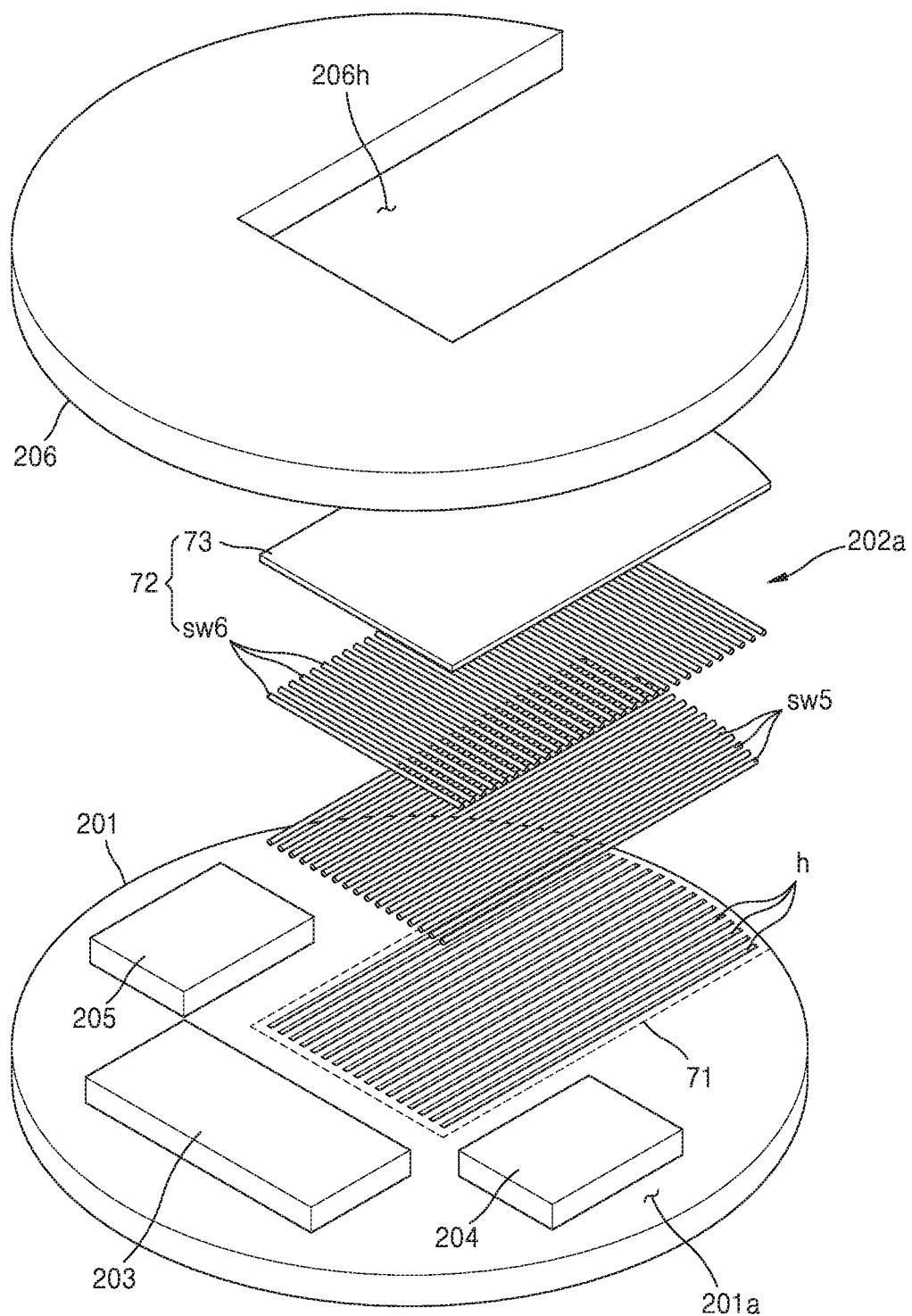
FIG. 12 is an exploded view of a third pressure sensor of the fourth pressure measuring apparatus according to an example embodiment.
Figure 13:
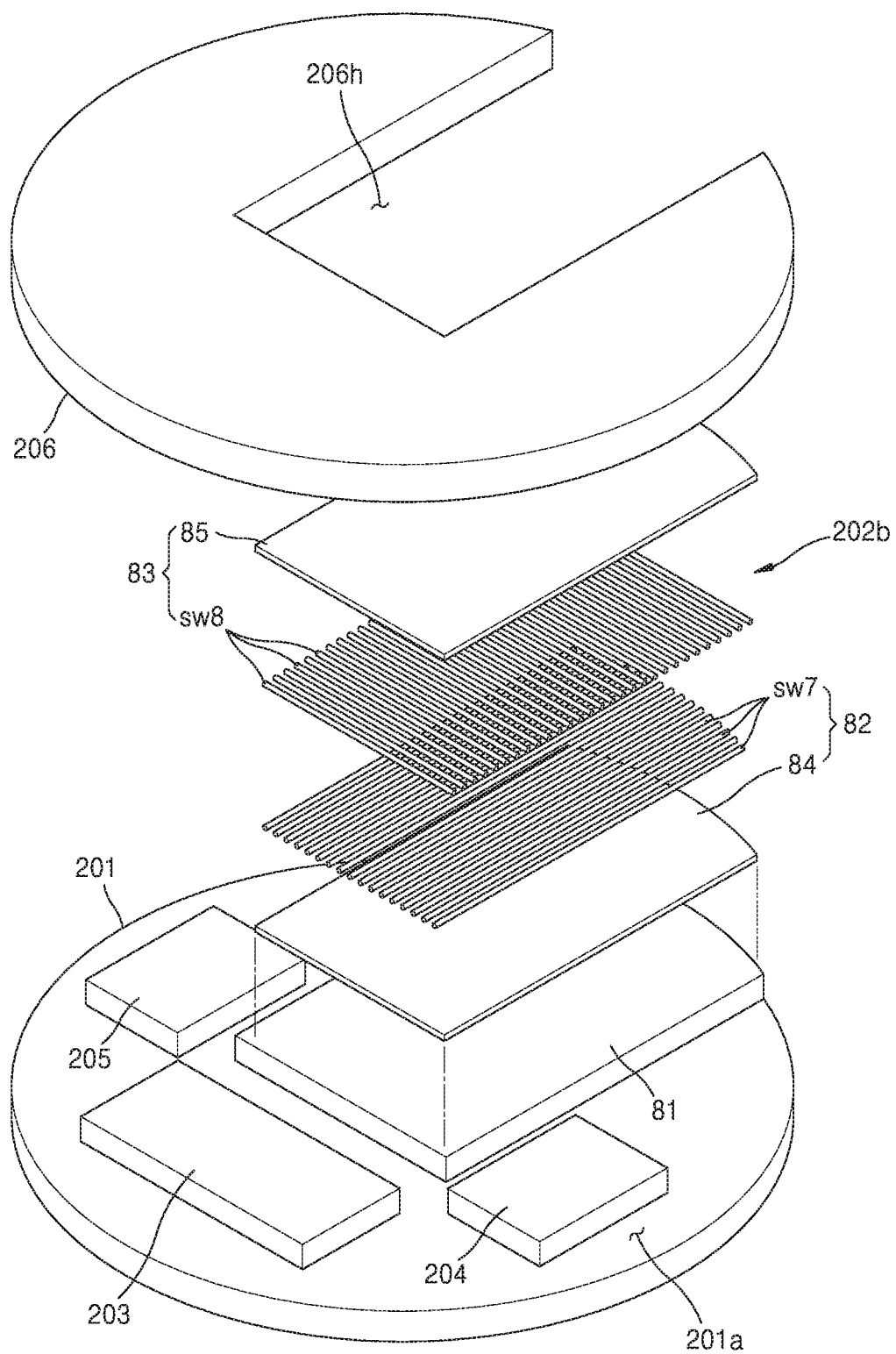
FIG. 13 is an exploded view of a fourth pressure sensor of the fourth pressure measuring apparatus according to an example embodiment.

In an example embodiment, the pressure sensor 202 of the fourth pressure measuring apparatus 200*a* may include any one of a third pressure sensor 202*a* and a fourth pressure sensor 202*b*. Referring to FIGS. 12 and 13, the technical features of the third pressure sensor 202*a* and the fourth pressure sensor 202*b* will be described in more detail.

FIG. 12 is an exploded view of a third pressure sensor 202*a* of the fourth pressure measuring apparatus 200*a* according to an example embodiment, and FIG. 13 is an exploded view of a fourth pressure sensor 202*b* of the fourth pressure measuring apparatus 200*a* according to an example embodiment.

Referring to FIG. 12, the third pressure sensor 202*a* may include a fifth sensor 71 and a sixth sensor 72 spaced apart from the fifth sensor 71 to face the fifth sensor 71. When the fifth sensor 71 contacts the sixth sensor 72 due to pressure from the discharged liquid L, the third pressure sensor 202*a* may generate sensed signals regarding the discharge pressure of the discharged liquid L.

In an example embodiment, the fifth sensor 71 may be formed on a first surface 201*a* of the second plate 201. In addition, the fifth sensor 71 may include fifth sensing wires sw5 formed on the first surface 201*a* of the second plate 201. In detail, the fifth sensing wires sw5 may be inserted into a groove h formed by etching the first surface 201*a* of the second plate 201. Here, the second plate 201 may include a wafer. For example, the second plate 201 may include a silicon wafer.

In an example embodiment, the sixth sensor 72 may include a fourth flexible substrate 73 and sixth sensing wires sw6 formed on the fourth flexible substrate 73. In detail, the fourth flexible substrate 73 may include a flexible printed circuit board. Because the sixth sensor 72 may include the fourth flexible substrate 73, one region of the sixth sensor 72 contacted by the discharged liquid L may contact the fifth sensing wires sw5 of the fifth sensor 71, and the other regions of the sixth sensor 72 not contacted by the discharged liquid L may not contact the fifth sensing wires sw5 of the fifth sensor 71.

The technical features of the fifth sensor 71 and the sixth sensor 72 may be substantially the same as the technical features of the first sensor 41 and the second sensor 42 described with reference to FIGS. 4 and 5, and thus, detailed descriptions thereof will be omitted.

However, the example embodiment is not limited thereto. In an example embodiment, the fifth sensor 71 formed on the second plate 201 may include the fifth sensing wires sw5 and the sixth sensing wires sw6. Also, the sixth sensor 72 may include a piezo-resistive material in a surface facing the fifth sensor 71.

In detail, the fifth sensing wires sw5 and the sixth sensing wires sw6 may be inserted into grooves h formed in the first surface 201*a* of the second plate 201 through etching. For example, the fifth sensing wires sw5 and the sixth sensing wires sw6 may be inserted into the grooves h, such that they are arranged in directions perpendicular to each other. Here, the second plate 201 may include a wafer.

In an example embodiment, the fifth sensing wires sw5 and the sixth sensing wires sw6 may constitute a plurality of fine lattices on the first surface 201*a* of the second plate 201. When the piezo-electric resistive material of the sixth sensor 72 physically contacts the lattices due to the discharged liquid L, the fifth sensor 71 and the sixth sensor 72 may precisely measure the discharge pressure of the discharged liquid L.

Referring to FIG. 13, the fourth pressure sensor 202*b* may include a second sensor board 81, a seventh sensor 82, and an eighth sensor 83. In an example embodiment, the second sensor board 81 may be attached onto the first surface 201*a* of the second plate 201. Also, the second sensor board 81 may be electrically connected to the seventh sensor 82 and the eighth sensor 83. When the seventh sensor 82 and the eighth sensor 83 physically contact each other due to the discharged liquid L, the second sensor board 81 may generate sensed signals regarding the discharge positions and the discharge pressure.

In an example embodiment, the seventh sensor 82 may include a fifth flexible substrate 84 and seventh sensing wires sw7 arranged in one direction on the fifth flexible substrate 84. Also, the seventh sensor 82 may be on the second sensor board 81. For example, the fifth flexible substrate 84 of the seventh sensor 82 may include a flexible printed circuit board. Also, the seventh sensing wires sw7 may be attached to the fifth flexible substrate 84, and portions of the surfaces of the seventh sensing wires sw7 may be exposed to the outside.

In an example embodiment, the eighth sensor 83 may be formed apart from the seventh sensor 82 to face the seventh sensor 82. The liquid L discharged from the nozzle 10 may reach the eighth sensor 83, and at least a portion of the eighth sensor 83 may contact the seventh sensor 82 due to the external force exerted on the eighth sensor 83 by the discharged liquid L. When the at least a portion of the eighth sensor 83 contacts the seventh sensor 82, the fourth pressure sensor 202*b* may generate sensed signals regarding the discharge positions of the discharged liquid L and the discharge pressure at the discharge positions.

In an example embodiment, the eighth sensor 83 may include a sixth flexible substrate 85 and eighth sensing wires sw8 arranged in one direction on the sixth flexible substrate 85. In detail, the sixth flexible substrate 85 may include a flexible printed circuit board. Because the eighth sensor 83 may include the sixth flexible substrate 85, one region of the eighth sensor 83 contacting the discharged liquid L may contact the seventh sensing wires sw7 of the seventh sensor 82, and the other regions of the eighth sensor 83 not contacting the discharged liquid L may not contact the seventh sensing wires sw7 of the seventh sensor 82.

The technical features of the seventh sensor 82 and the eighth sensor 83 may be substantially the same as the technical features of the third sensor 62 and the fourth sensor 63 described with reference to FIGS. 6 and 7, and thus, detailed descriptions thereof will be omitted.

However, the example embodiment is not limited thereto. In an example embodiment, the seventh sensor 82 on the second sensor board 81 may include the seventh sensing wires sw7 and the eighth sensing wires sw8. Also, the eighth sensor 83 may include a piezo-resistive material in a surface facing the seventh sensor 82.

In detail, the seventh sensing wires sw7 and the eighth sensing wires sw8 may be formed by being attached to the fifth flexible substrate 84 of the seventh sensor 82. At this time, portions of the surfaces of the seventh sensing wires sw7 and the eighth sensing wires sw8 may be exposed to the outside. For example, the seventh sensing wires sw7 and the eighth sensing wires sw8 may be formed by being attached to the fifth flexible substrate 84, such that the seventh sensing wires sw7 and the eighth sensing wires sw8 are arranged in directions perpendicular to each other.

In an example embodiment, the seventh sensing wires sw7 and the eighth sensing wires sw8 may constitute a plurality of fine lattices on the seventh sensor 82. When the piezo-electric resistive material of the eighth sensor 83 physically contacts the lattices due to the discharged liquid L, the seventh sensor 82 and the eighth sensor 83 may precisely measure the discharge pressure of the discharged liquid L.

Figure 14:
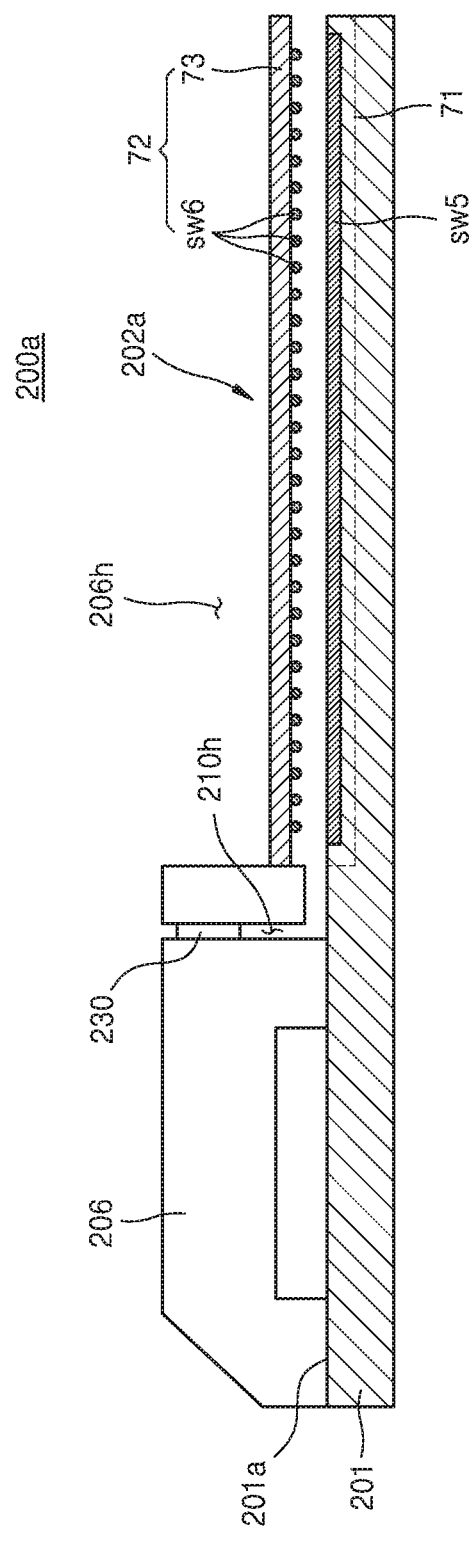
FIG. 14 is an internal cross-sectional view of the fourth pressure measuring apparatus according to an example embodiment.

FIG. 14 is a cross-sectional view of the fourth pressure measuring apparatus 200*a* according to an example embodiment. For example, FIG. 14 may be an internal cross-sectional view of the fourth pressure measuring apparatus 200*a* including the third pressure sensor 202*a*.

In example embodiment, a ventilation hole 210*h* may be formed in the casing 206. A space formed by the ventilation hole 201*h* in the casing 206 may be spatially connected to the third pressure sensor 202*a*. In detail, the ventilation hole 201*h* may be connected to the space between the fifth sensor 71 and the sixth sensor 72 of the third pressure sensor 202*a*. Because the ventilation hole 201*h* may be connected to the space between the fifth sensor 71 and the sixth sensor 72, the outside air may be introduced into the space between the fifth sensor 71 and the sixth sensor 72 through the ventilation hole 201*h*. The introduced air may reduce the difference between the temperature of the third pressure sensor 202*a* and the temperature outside of the fourth pressure measuring apparatus 200*a*. Because the ventilation hole 201*h* may be formed in the casing 206, deformation of the third pressure sensor 202*a* due to the temperature difference (e.g., mechanical contraction or expansion of the third pressure sensor 202*a* due to the temperature difference) may be reduced. Also, because the change in temperature of the third pressure sensor 202*a* may be small, the third pressure sensor 202*a* may precisely measure the discharge pressure of the discharged liquid L.

In an example embodiment, a check valve 230 may be coupled to the ventilation hole 210*h* of the casing 206. The check valve 230 may block introduction of the liquid L discharged from the nozzle 10 into the ventilation hole 210*h* while allowing introduction of a gas through the ventilation hole 210*h*. Therefore, the second controller 203, the second communicator 204, and the second power supply 205 formed on the first surface 201a of the second plate 201 may be protected from the discharged liquid L, and the fourth pressure measuring apparatus 200a may less likely be short-circuited.

In an example embodiment, the fourth pressure measuring apparatus 200a including the fourth pressure sensor 202b may also include technical features of the ventilation hole 210h and the check valve 230 described above.

Figure 15:
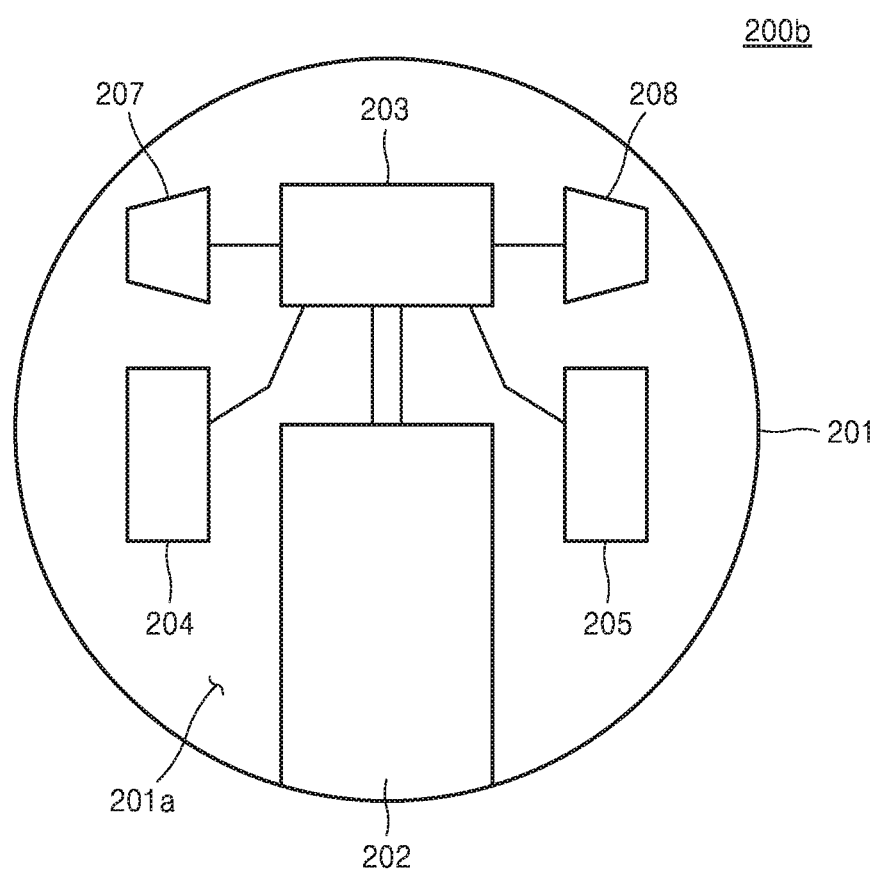
FIG. 15 is an internal plan view of a fifth pressure measuring apparatus according to an example embodiment.

FIG. 15 is an internal plan view of a fifth pressure measuring apparatus 200b according to an example embodiment. The fifth pressure measuring apparatus 200b may include the second plate 201, the pressure sensor 202, the second controller 203, the second communicator 204, the second power supply 205, and a casing and may further include a second temperature sensor 207 and a second shock sensor 208.

In one embodiment, the second temperature sensor 207 may include sensors capable of measuring at least any one of the temperature of the pressure sensor 202, the temperature of the liquid L discharged from the nozzle 10, and the temperature inside a chamber in which the fifth pressure measuring apparatus 200b is located. The second temperature sensor 207 may transmit sensed signals regarding measured temperatures to the second controller 203, and the second controller 203 may correct data regarding the discharge pressure of the discharged liquid L based on transmitted sensed signals regarding temperatures.

In an example embodiment, the second shock sensor 208 may include sensors capable of detecting deformation of the second plate 201 by the liquid L discharged from the nozzle 10. In detail, the second shock sensor 208 may detect information regarding the vibration of the second plate 201 due to the discharged liquid L and may also detect information regarding the warpage of the second plate 201 due to the discharged liquid L. The second shock sensor 208 may transmit sensed signals regarding the vibration and the warpage of the second plate 201 to the second controller 203, and the second controller 203 may correct data regarding the intensities of the discharge pressure of the discharged liquid L based on the sensed signals regarding the vibration and the warpage.

The technical features of the second temperature sensor 207 and the second shock sensor 208 may be substantially the same as the technical features of the first temperature sensor 107 and the first shock sensor 108 described with reference to FIG. 9, and thus, detailed descriptions thereof will be omitted.

Figure 16:
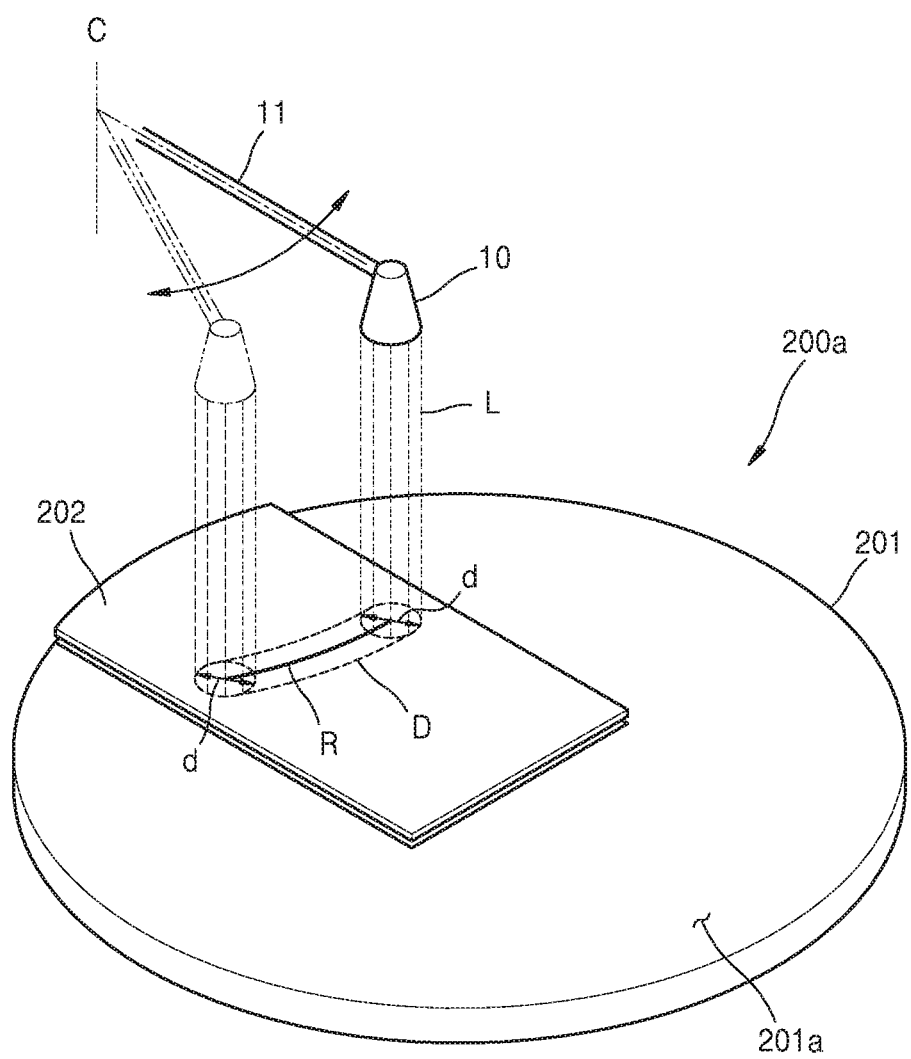
FIG. 16 is a perspective view of a nozzle and the fourth pressure measuring apparatus for measuring the discharge pressure of a liquid discharged from the nozzle according to an example embodiment.

FIG. 16 is a perspective view of the nozzle 10 and the fourth pressure measuring apparatus 200a according to an example embodiment for measuring the discharge pressure of a liquid L discharged from the nozzle 10.

In one embodiment, the nozzle 10 may jet the liquid L while rotating. Also, the discharge trail R that the nozzle 10 draws on the first surface 201a of the second plate 201 may be within a region formed by the pressure sensor 202. The technical features regarding the position and the shape of the pressure sensor 202 are substantially the same as those described above with reference to FIG. 10, and thus detailed descriptions thereof will be omitted.

Figure 17:
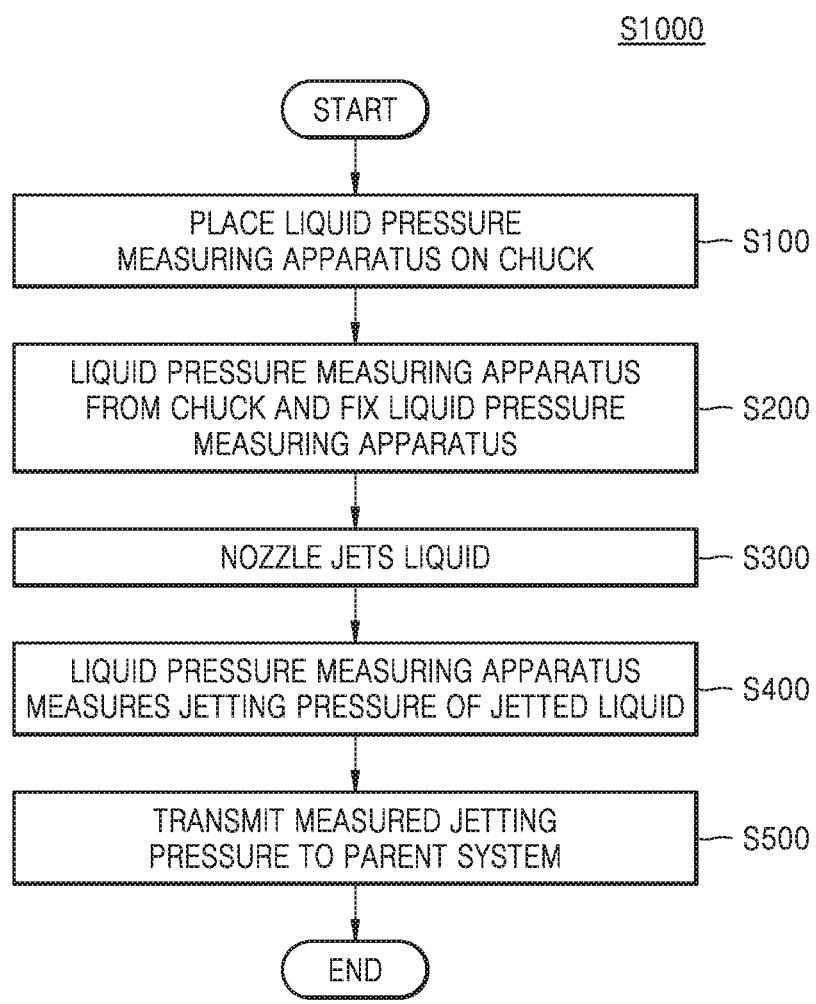
FIG. 17 is a flowchart of a method of measuring the discharge pressure of a liquid discharged from a nozzle through a pressure measuring apparatus according to an example embodiment.

FIG. 17 is a flowchart of a method S1000 of measuring the discharge pressure of the liquid L discharged from the nozzle 10 through a pressure measuring apparatus 100 according to an example embodiment.

In an example embodiment, the method S1000 of measuring the discharge pressure of the liquid L discharged from the nozzle 10 includes an operation S100 for placing a pressure measuring apparatus on a chuck, an operation S200 for lifting the pressure measuring apparatus from the chuck and fixing the pressure measuring apparatus, an operation S300 for discharge the liquid L through the nozzle 10, an operation S400 for measuring the discharge pressure of the discharged liquid L through the pressure measuring apparatus, and an operation S500 for transmitting a measured discharge pressure to a parent system.

In an example embodiment, operation S100 for placing the pressure measuring apparatus on the chuck may include placing at least any one pressure measuring apparatus from among first to fifth pressure measuring apparatuses 100a, 100b, 100c, 200a, and 200b described above on the chuck. The chuck may be a device having a flat surface for placing the pressure measuring apparatus to measure the discharge pressure of the liquid L discharged from the nozzle 10.

In an example embodiment, operation S200 for lifting the pressure measuring apparatus from the chuck and fixing the pressure measuring apparatus may include operation for lifting pressure measuring apparatus from the chuck in a direction toward the nozzle 10 through a lift pin of the chuck. Here, a distance between the pressure measuring apparatus and the nozzle 10 may be adjusted as needed.

Also, operation S200 for lifting the pressure measuring apparatus from the chuck and fixing the pressure measuring apparatus may include operation for fixing the pressure measuring apparatus through a fixing pin of the chuck. The pressure measuring apparatus may be firmly fixed by the fixing pin, and thus separation of the pressure measuring apparatus from the chuck due to the discharged liquid L may be prevented. For example, when the pressure measuring apparatus has the shape of a disk, the fixing pin may fix the pressure measuring apparatus in a radial direction.

In an example embodiment, operation for discharging the liquid L through the nozzle 10 may include operation for discharging the liquid L while the nozzle 10 is in a fixed state. However, the example embodiment is not limited thereto, and operation S300 for discharging the liquid L through the nozzle 10 may include operation for discharging the liquid L while the nozzle 10 is rotating as described above.

In an example embodiment, operation S400 for measuring the discharge pressure of the discharged liquid L through the pressure measuring apparatus may be an operation for measuring the discharge pressure of the discharged liquid L by using any one of the above-stated pressure measuring apparatuses. The pressure measuring apparatus may measure discharge positions and the discharge pressure of the discharged liquid L at the discharge positions.

In an example embodiment, operation S500 for transmitting the measured discharge pressure to the parent system may be an operation for transmitting data regarding the discharge positions and the discharge pressure of the discharged liquid L to the parent system. The parent system may include a display for visually displaying data regarding the discharge positions and the discharge pressure of the discharged liquid L. The parent system may also include a nozzle controller for controlling the discharge pressure of the nozzle 10 based on the data.

While example embodiments have been particularly shown and described above, it will be understood that various changes in form and details may be made therein without departing from the spirit and scope of the following claims.

What is claimed is:

1. A pressure measuring apparatus for measuring a discharge pressure of a liquid discharged from a nozzle comprising:
   a plate comprising:
      a first surface facing the nozzle; and
      a second surface opposite to the first surface;
   a pressure sensor configured to detect a discharge position and the discharge pressure at the discharge position of the liquid and generate a signal based on the discharge pressure; and
   electrical components comprising a controller configured to receive the signal and collect data regarding the discharge pressure,
   wherein the pressure sensor is provided on the first surface of the plate and the electrical components are provided on the second surface of the plate,
   wherein the pressure sensor comprises a first sensor comprising first sensing wires inserted in a first plurality of grooves formed in the first surface of the plate,
   wherein the pressure sensor further comprises a second sensor provided to be spaced apart from the first sensor and disposed to face the first sensor, and
   wherein the signal is generated by the second sensor based on the second sensor being brought into contact with the first sensing wires, that are within the first plurality of grooves, by the liquid discharged from the nozzle.

2. The pressure measuring apparatus of claim 1, wherein the plate comprises a wafer.

3. The pressure measuring apparatus of claim 2,
   wherein the second sensor comprises:
      a flexible substrate; and
      second sensing wires extending on the flexible substrate in a second direction perpendicular to a first direction in which the first sensing wires and the first plurality of grooves extend,
   wherein the electrical components further comprise:
      a communicator configured to transmit the data to an external device; and
      a power supply configured to supply power to the pressure measuring apparatus, and
   wherein the signal is generated by the second sensor based on the second sensing wires being brought into contact with the first sensing wires, that are within the first plurality of grooves, by the liquid discharged from the nozzle.

4. The pressure measuring apparatus of claim 1, further comprising:
   a casing configured to cover the second surface of the plate;
   a check valve provided at the casing and configured to control inflow of a gas into the casing and configured to block introduction of the liquid discharged from the nozzle; and
   a via electrode configured to penetrate through the plate,
   wherein the pressure sensor and the controller are electrically connected to each other through the via electrode.

5. The pressure measuring apparatus of claim 1, further comprising a temperature sensor configured to measure a temperature of at least any one of the pressure sensor, the liquid discharged from the nozzle, or an inside of a chamber in which the pressure measuring apparatus is located,
   wherein the controller is configured to correct the data based on the temperature measured by the temperature sensor.

6. The pressure measuring apparatus of claim 1, further comprising a shock sensor configured to detect deformation of the plate by the liquid discharged from the nozzle.

7. The pressure measuring apparatus of claim 1, wherein, when the nozzle is configured to discharge the liquid while rotating, a discharge trail formed on the first surface by the nozzle is located within a region formed by the pressure sensor.

8. A pressure measuring apparatus for measuring a discharge pressure of a liquid discharged from a nozzle comprising:
   a plate comprising:
      a first surface facing the nozzle; and
      a second surface opposite to the first surface;
   a pressure sensor configured to detect a discharge position and the discharge pressure at the discharge position of the liquid and generate a signal based on the discharge pressure; and
   electrical components comprising a controller configured to receive the signal and collect data regarding the discharge pressure,
   wherein the pressure sensor is provided on the first surface of the plate and the electrical components are provided on the second surface of the plate,
   wherein the pressure sensor comprises a first sensor comprising first sensing wires inserted in a first plurality of grooves formed in the first surface of the plate,
   wherein the plate comprises a wafer,
   wherein each of the first sensing wires and the first plurality of grooves extend in a first direction,
   wherein the first sensor further comprises second sensing wires inserted into a second plurality of grooves formed in the first surface of the plate, and each of the second sensing wires and the second plurality of grooves extending in a second direction perpendicular to the first direction,
   wherein the pressure sensor further comprises a second sensor provided spaced apart from the first sensor, disposed to face the first sensor and comprising a piezo-resistive material,
   wherein the first sensing wires overlap the second sensing wires in a third direction perpendicular to the first direction and the second direction, and
   wherein the signal is generated by the second sensor based on the piezo-resistive material of the second sensor being pressed into contact with lattices, constituted by the first sensing wires and the second sensing wires of the first sensor, by the liquid discharged from the nozzle.

* * * * *